United States Patent
Kim et al.

(10) Patent No.: US 9,023,980 B2
(45) Date of Patent: May 5, 2015

(54) ORGANIC PASSIVATION LAYER COMPOSITION, TRANSISTOR AND/OR ELECTRONIC DEVICE INCLUDING ORGANIC PASSIVATION LAYER FABRICATED THEREFROM

(75) Inventors: Joo Young Kim, Suwon-si (KR); Myung-Sup Jung, Seongnam-si (KR); Byong Gwon Song, Seoul (KR); Bon Won Koo, Suwon-si (KR); Byung Wook Yoo, Seongnam-si (KR); Ji Youl Lee, Seoul (KR); Do Hwan Kim, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 233 days.

(21) Appl. No.: 13/475,227

(22) Filed: May 18, 2012

(65) Prior Publication Data

US 2012/0291857 A1  Nov. 22, 2012

(30) Foreign Application Priority Data

May 19, 2011   (KR) .......................... 10-2011-0047434

(51) Int. Cl.
| | |
|---|---|
| C08G 73/06 | (2006.01) |
| C08G 73/10 | (2006.01) |
| C09D 179/08 | (2006.01) |
| C08L 79/08 | (2006.01) |
| H01L 51/10 | (2006.01) |
| C08G 73/00 | (2006.01) |
| H01L 51/00 | (2006.01) |
| H01L 51/05 | (2006.01) |

(52) U.S. Cl.
CPC .............. C09D 179/08 (2013.01); C08L 79/08 (2013.01); H01L 51/107 (2013.01); *H01L 51/0036* (2013.01); *H01L 51/0525* (2013.01); *H01L 51/0545* (2013.01); *Y02E 10/549* (2013.01)

(58) Field of Classification Search
CPC ....................................................... C08L 79/08
USPC ................................ 528/423, 422; 525/330.9
See application file for complete search history.

(56) References Cited

U.S. PATENT DOCUMENTS

| | | | |
|---|---|---|---|
| 7,745,096 B2 | 6/2010 | Jung et al. | |
| 8,003,729 B2 | 8/2011 | Kim et al. | |
| 2008/0187867 A1 | 8/2008 | Jung et al. | |
| 2010/0304291 A1 | 12/2010 | Ebara | |

FOREIGN PATENT DOCUMENTS

| | | |
|---|---|---|
| CN | 101447553 | 6/2009 |
| EP | 1 995 799 | 11/2008 |
| KR | 100833706 B1 | 5/2008 |
| KR | 102008010210 A | 11/2008 |
| WO | WO 84/02529 | 7/1984 |

OTHER PUBLICATIONS

Minegishi et al; Negative working photosensitive resin compositions—electronic parts; Feb. 2008; Jpn, Kokai Tokkyo Koho; Chem Abstract 148:250131.*
Minegishi et al; Positive working photosensitive resist composition—electronic device; Nov. 2006; Jpn, Kokai Tokkyo Koho; Chem Abstract 145: 480461.*
European Search Report dated Jul. 17, 2012 issued in corresponding European Application No. 12168556.4-2115.
Chinese Office Action dated Nov. 15, 2014 issued in corresponding Chinese Application No. 201210157507.9 (with translation).

* cited by examiner

*Primary Examiner* — Duc Truong
(74) *Attorney, Agent, or Firm* — Harness, Dickey & Pierce, PLC

(57) ABSTRACT

According to example embodiments, an organic passivation layer composition includes a cross-linking agent and an oligomer or a polymer including structural units represented by the following Chemical Formulae 1 and 2:

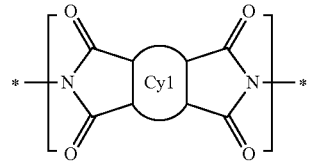

[Chemical Formula 1]

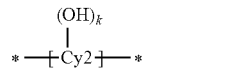

[Chemical Formula 2]

In Chemical Formulae 1 and 2, each substituent is defined in the detailed description.

23 Claims, 21 Drawing Sheets

ORGANIC PASSIVATION LAYER COMPOSITION, TRANSISTOR AND/OR ELECTRONIC DEVICE INCLUDING ORGANIC PASSIVATION LAYER FABRICATED THEREFROM

CROSS-REFERENCE TO RELATED APPLICATION

This application claims priority under 35 U.S.C. §119 to Korean Patent Application No. 10-2011-0047434, filed in the Korean Intellectual Property Office on May 19, 2011, the entire contents of which are incorporated herein by reference.

BACKGROUND

1. Field

Example embodiments relate to an organic passivation layer composition and/or a transistor including an organic passivation layer fabricated therefrom and/or an electronic device including an organic passivation layer fabricated therefrom.

2. Description of the Related Art

A thin film transistor may be used as a switching device for a flat panel display such as a liquid crystal display (LCD), an organic light emitting diode (OLED) display, an electrophoretic display, or the like.

Conventionally, the semiconductor layer of a thin film transistor may include an inorganic semiconductor material such as silicon (Si). Inorganic semiconductor materials may be expensive and require a high temperature vacuum process. Research is underway on substituting the inorganic semiconductor material with an organic semiconductor material.

An the organic thin film transistor may be fabricated by a solution process at a low temperature, an organic thin film transistor may simplify the process and save cost compared to a flat panel display made with a silicon-based material and a vacuum deposition process. In addition, an organic thin film transistor may be formed in a shape such as a fiber or a film considering the characteristics of the organic material.

Recently, thin film transistors using the organic semiconductor material having high performance such that the electrical characteristics such as charge mobility and current on-off ratio are comparable to the conventional inorganic semiconductor device using a-Si have been reported. However, for the commercialization of organic thin film transistors by substituting for the conventional inorganic semiconductor device, long-term reliability is desired.

SUMMARY

When an organic thin film transistor using an organic semiconductor is driven, the device is repeatedly exposed to an electric field for a long time and may cause a phenomenon of a shift of a threshold voltage and a decrease of mobility. The phenomenon is believed to result from exposure to long-term bias stress, and is believed to be a factor in deterioration of device reliability.

According to example embodiments, an organic passivation layer composition improves the long-term reliability of at least one of an organic thin film transistor, an organic thin film transistor, and an electronic device.

According to example embodiments, an organic passivation layer composition includes a cross-linking agent and an oligomer or a polymer including structural units represented by the following Chemical Formulae 1 and 2.

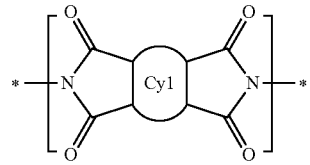

[Chemical Formula 1]

In Chemical Formula 1,
Cy1 is a functional group including one of a substituted or unsubstituted C4 to C20 carbocyclic group, a substituted or unsubstituted C6 to C20 monocyclic aromatic group, a substituted or unsubstituted C2 to C20 condensed polycyclic aromatic group, and a C2 to C20 non-condensed polycyclic aromatic group.

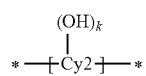

[Chemical Formula 2]

In Chemical Formula 2,
Cy2 is one of a substituted or unsubstituted C6 to C40 arylene group, a substituted or unsubstituted C3 to C40 heteroarylene group, a substituted or unsubstituted C5 to C40 cycloalkylene group, and a substituted or unsubstituted C5 to C40 heterocycloalkylene group, and
k is an integer of 2 or more.

The oligomer or a polymer may further include a structural unit represented by the following Chemical Formula 3:

[Chemical Formula 3]

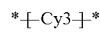

In Chemical Formula 3,
Cy3 is one of a substituted or unsubstituted C6 to C40 arylene group, a substituted or unsubstituted C3 to C40 heteroarylene group, a substituted or unsubstituted C5 to C40 cycloalkylene group, and a substituted or unsubstituted C5 to C40 heterocycloalkylene group.

The structural units represented by Chemical Formulae 2 and 3 may be present at a mole ratio of about 50:50 to about 90:10.

Cy1 of Chemical. Formula 1 may include one of the following Chemical Formulae 4-1 and 4-2.

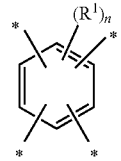

[Chemical Formula 4-1]

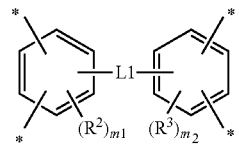

[Chemical Formula 4-2]

In Chemical Formulae 4-1 and 4-2,
$R^1$ to $R^3$ are each independently one of a hydrogen, a hydroxy group, a halogen, a substituted or unsubstituted C1 to C15 alkyl group, a substituted or unsubstituted C1 to C15 alkoxy group, a substituted or unsubstituted C1 to C15 fluoroalkyl group, a substituted or unsubstituted C3 to C15 cycloalkyl group, a substituted or unsubstituted C3 to C15 heterocycloalkyl group, a substituted or unsubstituted C3 to C15 cycloalkyloxy group, a substituted or unsubstituted C6 to C15 aryl group, a substituted or unsubstituted C6 to C15 aryloxy group, and a substituted or unsubstituted C2 to C15 heteroaryl group, L1 is one of a single bond, $(CR^aR^b)_p$, $(SiR^cR^d)_q$ (wherein $R^a$ to $R^d$ are each independently one of a hydrogen, a halogen, a hydroxy group, a C1 to C10 alkyl group, a C1 to C10 fluoroalkyl group, and a C6 to C20 aryl group, and p and q are each independently integers ranging from 1 to 5), $S(=O)_2$, O, $C(=O)$, and a combination thereof, and n, m1, and m2 are each independently integers ranging from 0 to 2.

The above Chemical Formula 2 may include one of the following Chemical Formulae 5-1 and 5-2.

[Chemical Formula 5-1]

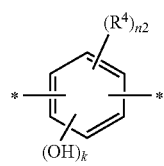

[Chemical Formula 5-2]

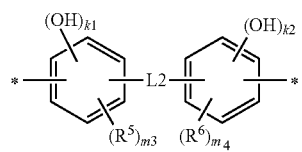

In Chemical Formulae 5-1 and 5-2, $R^4$ to $R^6$ are each independently one of a hydrogen, a halogen, a substituted or unsubstituted C1 to C15 alkyl group, a substituted or unsubstituted C1 to C15 alkoxy group, a substituted or unsubstituted C1 to C15 fluoroalkyl group, a substituted or unsubstituted C3 to C15 cycloalkyl group, a substituted or unsubstituted C3 to C15 heterocycloalkyl group, a substituted or unsubstituted C3 to C15 cycloalkyloxy group, a substituted or unsubstituted C6 to C15 aryl group, a substituted or unsubstituted C6 to C15 aryloxy group, and a substituted or unsubstituted C2 to C15 heteroaryl group, L2 is one of a single bond, $(CR^aR^b)_p$, $(SiR^cR^d)_q$ (wherein $R^a$ to $R^d$ are each independently one of a hydrogen, a halogen, a hydroxy group, a C1 to C10 alkyl group, a C1 to C10 fluoroalkyl group, and a C6 to C20 aryl group, and p and q are each independently integers ranging from 1 to 5), $S(=O)_2$, O, $C(=O)$, and a combination thereof, n2 is an integer ranging from 0 to 2, m3 and m4 are each independently integers ranging from 0 to 4, k and k1+k2 are each independently integers of 2 or more, and k1 and k2 are integers ranging from 0 to 4.

The above Chemical Formula 3 may include one of the following Chemical Formulae 6-1 and 6-2.

[Chemical Formula 6-1]

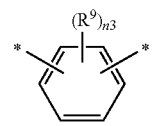

[Chemical Formula 6-2]

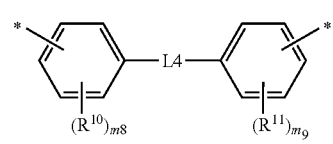

In Chemical Formulae 6-1 and 6-2, $R^9$ to $R^{11}$ are each independently one of a hydrogen, a halogen, a substituted or unsubstituted C1 to C15 alkyl group, a substituted or unsubstituted C1 to C15 alkoxy group, a substituted or unsubstituted C1 to C15 fluoroalkyl group, a substituted or unsubstituted C3 to C15 cycloalkyl group, a substituted or unsubstituted C3 to C15 heterocycloalkyl group, a substituted or unsubstituted C3 to C15 cycloalkyloxy group, a substituted or unsubstituted C6 to C15 aryl group, a substituted or unsubstituted C6 to C15 aryloxy group, and a substituted or unsubstituted C2 to C15 heteroaryl group, L4 is one of a single bond, $(CR^aR^b)_p$, $(SiR^cR^d)_q$ (wherein $R^a$ to $R^d$ are each independently one of a hydrogen, a halogen, a C1 to C10 alkyl group, a C1 to C10 fluoroalkyl group, and a C6 to C20 aryl group, and p and q are each independently integers ranging from 1 to 5), $S(=O)_2$, O, $C(=O)$, and a combination thereof, n3 is an integer ranging from 0 to 4, and m8 and m9 are each independently integers ranging from 0 to 4.

The above Chemical Formula 2 may include one of the following Chemical Formula 7.

[Chemical Formula 7]

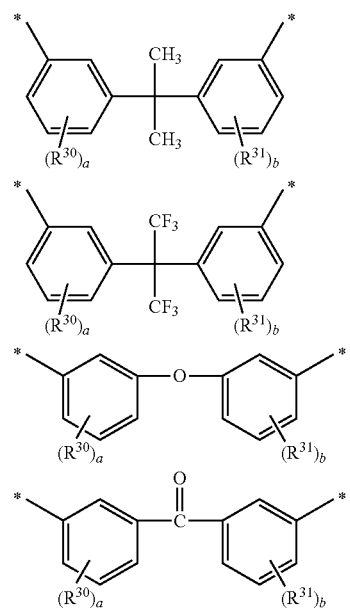

-continued

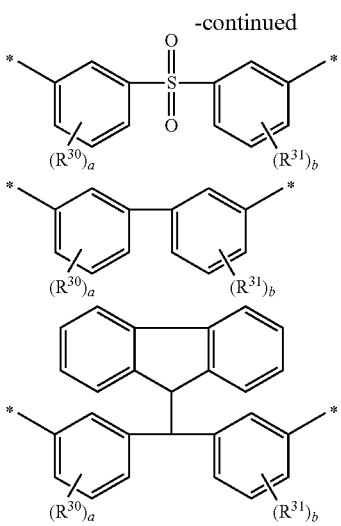

In Chemical Formula 7,
$R^{30}$ and $R^{31}$ are each independently one of a hydrogen, a hydroxy group, a halogen, a substituted or unsubstituted C1 to C15 alkyl group, a substituted or unsubstituted C1 to C15 alkoxy group, a substituted or unsubstituted C1 to C15 fluoroalkyl group, a substituted or unsubstituted C3 to C15 cycloalkyl group, a substituted or unsubstituted C3 to C15 heterocycloalkyl group, a substituted or unsubstituted C3 to C15 cycloalkyloxy group, a substituted or unsubstituted C6 to C15 aryl group, a substituted or unsubstituted C6 to C15 aryloxy group, and a substituted or unsubstituted C2 to C15 heteroaryl group, provided that at least two of $R^{30}$ and $R^{31}$ are a hydroxy group,
a and b each independently range from 0 to 4, and a+b is 2 or more.

The above Chemical Formula 3 may include one of the following Chemical Formula 8.

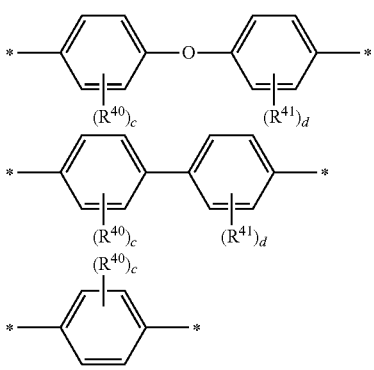

In Chemical Formula 8,
$R^{40}$ and $R^{41}$ are each independently one of a hydrogen, a halogen, a substituted or unsubstituted C1 to C15 alkyl group, a substituted or unsubstituted C1 to C15 alkoxy group, a substituted or unsubstituted C1 to C15 fluoroalkyl group, a substituted or unsubstituted C3 to C15 cycloalkyl group, a substituted or unsubstituted C3 to C15 heterocycloalkyl group, a substituted or unsubstituted C3 to C15 cycloalkyloxy group, a substituted or unsubstituted C6 to C15 aryl group, a substituted or unsubstituted C6 to C15 aryloxy group, and a substituted or unsubstituted C2 to C15 heteroaryl group, and do not include a hydroxy group,
c and d each independently range from 0 to 4, and c+d is 2 or more.

The structural unit of the above Chemical Formula 1 may include structural units represented by the following Chemical Formulae 9 and 10.

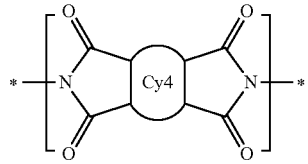

In Chemical Formula 9,
Cy4 is one of a substituted or unsubstituted C4 to C20 carbocyclic group, a substituted or unsubstituted C6 to C20 monocyclic aromatic group, a substituted or unsubstituted C2 to C20 condensed polycyclic aromatic group, and a C2 to C20 non-condensed polycyclic aromatic group, and is a cyclic group unsubstituted with at least one fluoro group or at least one C1 to C15 fluoroalkyl group.

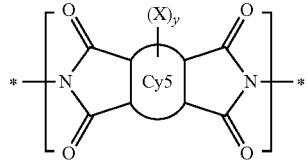

In Chemical Formula 10, Cy5 is one of a substituted or unsubstituted C4 to C20 carbocyclic group, a substituted or unsubstituted C6 to C20 monocyclic aromatic group, a substituted or unsubstituted C2 to C20 condensed polycyclic aromatic group, and a C2 to C20 non-condensed polycyclic aromatic group,
X is one of a fluoro group and a C1 to C15 fluoroalkyl group, and
y is determined by a valence of Cy5 and is an integer ranging from 1 to 4.

Cy4 of the above Chemical Formula 9 may be one of the following Chemical Formulae 9-1 and 9-2.

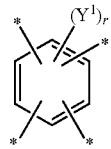

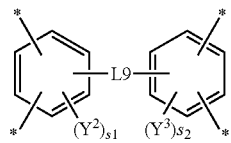

In Chemical Formulae 9-1 and 9-2,
$Y^1$ to $Y^3$ are each independently one of a hydrogen, a hydroxy group, a substituted or unsubstituted C1 to C15 alkyl group, a substituted or unsubstituted C1 to C15 alkoxy group, a substituted or unsubstituted C3 to C15 cycloalkyl group, a substituted or unsubstituted C3 to C15 heterocycloalkyl group, a substituted or unsubstituted C3 to C15 cycloalkyloxy group, a substituted or unsubstituted C6 to C15 aryl group, a substituted or unsubstituted C6 to C15 aryloxy group, and a substituted or unsubstituted C2 to C15 heteroaryl group, L9 is one of a single bond, $(CR^aR^b)_p$, $(SiR^cR^d)_q$ (wherein $R^a$ to $R^d$ are each independently one of a hydrogen, a hydroxy group, a C1 to 010 alkyl group, and a C6 to C20 aryl group, and p and q are each independently integers ranging from 1 to 5), $S(=O)_2$, O, $C(=O)$, and a combination thereof, and r, s1, and s2 are each independently integers ranging from 0 to 2.

Cy5 of the above Chemical Formula 10 may be one of the following Chemical Formulae 10-1 and 10-2.

[Chemical Formula 10-1]

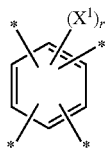

[Chemical Formula 10-2]

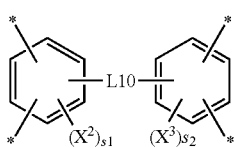

In Chemical Formulae 10-1 and 10-2, $X^1$ to $X^3$ are each independently one of a fluoro group and a C1 to C15 fluoroalkyl group, L10 is one of a single bond, $(CR^aR^b)_p$, $(SiR^cR^d)_q$ (wherein $R^a$ to $R^d$ are each independently one of a hydrogen, a halogen (—F, —Cl, —Br, or —I), a hydroxy group, a C1 to C10 alkyl group, a C1 to C10 fluoroalkyl group, and a C6 to C20 aryl group, and p and q are each independently integers ranging from 1 to 5), $S(=O)_2$, O, $C(=O)$, and a combination thereof, and r, s1, and s2 are each independently integers ranging from 0 to 2.

Each C6 aromatic ring of the above Chemical Formulae 10-1 and 10-2 is substituted with a substituent including one of a C1 to C15 alkyl group, a substituted or unsubstituted C1 to C15 alkoxy group, a substituted or unsubstituted C3 to C15 cycloalkyl group, a substituted or unsubstituted C3 to C15 heterocycloalkyl group, a substituted or unsubstituted C3 to C15 cycloalkyloxy group, a substituted or unsubstituted C6 to C15 aryl group, a substituted or unsubstituted C6 to C15 aryloxy group, and a substituted or unsubstituted C2 to C15 heteroaryl group.

The structural unit of Chemical Formula 10 may be included at about 50 mol % or less, for example, about 5 to about 30 mol %, based on the total of 100 mol % of structural units of Chemical Formula 9 and Chemical Formula 10.

The cross-linking agent may be a compound including two or more vinyl ether groups.

Examples of the cross-linking agent may include one of 2,2'-bis(4-(2-(vinyloxy)ethoxy)phenyl)propane (BPA-DEVE), (1,1,1-tris(4-2-(vinyloxy)ethoxy)phenyl)ethane, 1,3,5-tris(2-(vinyloxy)ethoxy)benzene, poly(ethylene glycol)divinyl ether, 4,4'-bis-but-3-enyloxy-biphenyl, 1,5-bis-but-3-enyloxy-naphthalene, and a mixture thereof.

The organic passivation layer composition may further include a photoacid generator. The photoacid generator may include one of triarylsulfonium perfluoroalkyl sulfonate, triarylsulfonium triflate, diaryliodonium triflate, triarylsulfonium nonaflate, diaryliodonium nonaflate, succinimidyl triflate, 2,6-dinitrobenzyl sulfonate, and a combination thereof.

According to example embodiments, an organic passivation layer may be fabricated from the organic passivation layer composition.

According to example embodiments, a thin film transistor and/or an electronic device may include the organic passivation layer. The electronic device may be a solar cell, a memory device, an organic light emitting diode (OLED), a photosensor, a laser device, and the like.

According to example embodiments, a thin film transistor includes a substrate, a gate electrode on the substrate, an organic semiconductor layer on the substrate, a gate insulating layer between the gate electrode and the organic semiconductor layer, source and drain electrodes connected to the organic semiconductor layer, and an organic passivation layer fabricated using the organic passivation composition. The organic passivation layer may cover at least the organic semiconductor layer.

A material of the gate insulating layer may be the same as a material of the organic passivation layer.

The organic passivation layer may be configured to limit at least one of a threshold voltage change over time and a charge mobility change over time.

According to example embodiments, a solar cell includes an organic photoactive layer between a pair of electrodes and an organic passivation layer fabricated from the organic passivation composition. The organic passivation layer may cover the organic photoactive layer and the pair of electrodes.

According to example embodiments, a solar cell module may include a plurality of organic photoactive layers, each photoactive layer between a pair of electrodes, and an organic passivation layer fabricated from the organic passivation composition. The organic passivation layer may cover the plurality of organic photoactive layers between the pair of electrodes.

BRIEF DESCRIPTION OF THE DRAWINGS

Example embodiments of inventive concepts will be more clearly understood from the following brief description taken in conjunction with the accompanying drawings, in which.

Figure 1A:
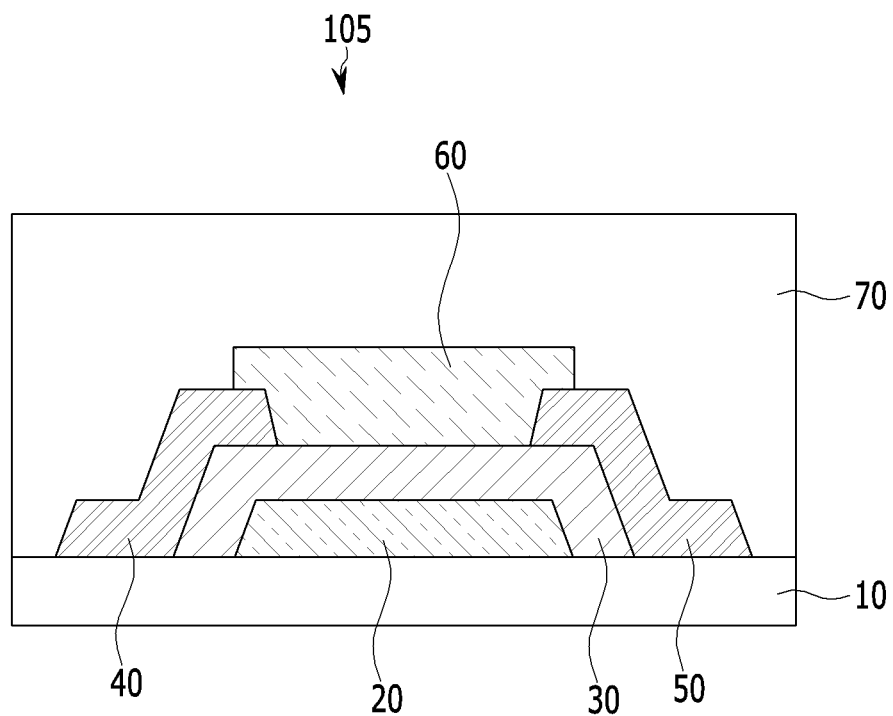
FIG. 1A is a schematic cross-sectional view of an organic thin film transistor having a bottom-contact and bottom-gate structure according to example embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions, panels, and/or structural elements may be reduced or exaggerated for clarity. The use of like reference numbers in the various drawings is intended to indicate the presence of like elements or features throughout the different views.

DETAILED DESCRIPTION

Example embodiments will be described more fully hereinafter with reference to the accompanying drawings, in which some example embodiments are shown. Example embodiments may, however, be embodied in many different forms and should not be construed as limited to the example embodiments set forth herein; rather, these example embodiments are provided so that this disclosure will be thorough and complete, and will fully convey the scope of example embodiments of inventive concepts to those of ordinary skill in the art. The description of like elements may be omitted to avoid redundancy.

As used herein, when a definition is not otherwise provided, the term "C4 to C20 carbocyclic group" may refer to a monocyclic alicyclic group or a fused ring of monocyclic alicyclic groups, for example, C4 to C20 cycloalkyl group. The carbocyclic group may have a substituent such as a halogen (—F, —Cl, —Br, or —I), a C1 to C20 haloalkyl group, a nitro group, a cyano group, a C1 to C20 alkoxy group, and a lower C1 to C10 alkylamino group.

The term "C6 to C20 monocyclic aromatic group" may refer to a singular ring or a fused ring of a C6 to C20 aryl group or a C6 to C20 heteroaryl group to provide a resonance structure. The monocyclic aromatic group may have a substituent such as a halogen (—F, —Cl, —Br, or —I), a C1 to C20 haloalkyl group, a nitro group, a cyano group, a C1 to C20 alkoxy group, and a C1 to C10 lower alkylamino group.

The term "C2 to C20 condensed polycyclic aromatic group" may indicate cycles condensed with one another. At least one of hydrogen atoms among condensed cyclic aromatic groups may be replaced with a substituent such as a halogen (—F, —Cl, —Br, or —I), a C1 to C20 haloalkyl group, a nitro group, a cyano group, a C1 to C20 alkoxy group, and a lower C1 to C10 alkylamino group.

The term "C2 to C20 non-condensed polycyclic aromatic groups" may indicate an aromatic system including several aromatic cycles linked to one another directly or by a linker. The linker may be a C1 to C10 alkylene group, a C1 to C10 alkylene group substituted with a C1 to C10 alkyl group or a C1 to C10 fluoroalkyl group, $S(=O)_2$, $C(=O)$, O, and the like. The C2 to C20 non-condensed polycyclic aromatic groups may be substituted with a halogen (—F, —Cl, —Br, or —I), a C1 to C20 haloalkyl group, a nitro group, a cyano group, a C1 to C20 alkoxy group, and a C1 to C10 lower alkylamino group.

As used herein, when a definition is not otherwise provided, the term "substituted" refers to one substituted with a substituent selected from a halogen (—F, —Cl, —Br, or —I), a C1 to C15 haloalkyl group, a nitro group, a cyano group, a C1 to C15 alkoxy group, and a lower C1 to C10 alkylamino group.

As used herein, when a definition is not otherwise provided, the prefix "hetero" refers to a functional group including 1 to 3 heteroatoms selected from N, O, S, P, and Si.

In addition, in the specification, the mark "*" may refer to where something is connected with the same or different atom or chemical formula.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Other words used to describe the relationship between elements or layers should be interpreted in a like fashion (e.g., "between" versus "directly between," "adjacent" versus "directly adjacent," "connected" versus "directly connected").

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

According to example embodiments, an organic passivation layer composition including an oligomer or a polymer including structural units represented by the following Chemical Formulae 1 and 2, and optionally Chemical Formula 3, and a cross-linking agent, is provided.

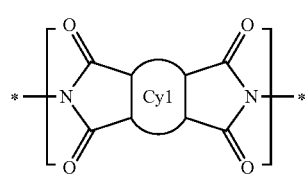

[Chemical Formula 1]

In Chemical Formula 1,

Cy1 is a functional group selected from a substituted or unsubstituted C4 to C20 carbocyclic group, a substituted or unsubstituted C6 to C20 monocyclic aromatic group, a substituted or unsubstituted C2 to C20 condensed polycyclic aromatic group, and a C2 to C20 non-condensed polycyclic aromatic group.

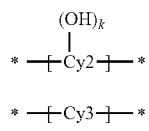

[Chemical Formula 2]

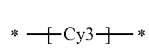

[Chemical Formula 3]

In Chemical Formulae 2 and 3,

Cy2 and Cy3 are each independently a substituted or unsubstituted C6 to C40 arylene group, a substituted or unsubstituted C3 to C40 heteroarylene group, a substituted or unsubstituted C5 to C40 cycloalkylene group, or a substituted or unsubstituted C5 to C40 heterocycloalkylene group, and k is an integer of 2 or more.

Cy1 of the above Chemical Formula 1 may be selected from the following Chemical Formulae 4-1 and 4-2.

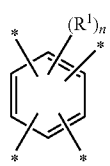

[Chemical Formula 4-1]

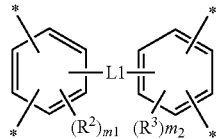

[Chemical Formula 4-2]

In Chemical Formulae 4-1 and 4-2, $R^1$ to $R^3$ are each independently hydrogen, a hydroxy group, a halogen (—F, —Cl, —Br, or —I), a substituted or unsubstituted C1 to C15 alkyl group, a substituted or unsubstituted C1 to C15 alkoxy group, a substituted or unsubstituted C1 to C15 fluoroalkyl group, a substituted or unsubstituted C3 to C15 cycloalkyl group, a substituted or unsubstituted C3 to C15 heterocycloalkyl group, a substituted or unsubstituted C3 to C15 cycloalkyloxy group, a substituted or unsubstituted C6 to C15 aryl group, a substituted or unsubstituted C6 to C15 aryloxy group, or a substituted or unsubstituted C2 to C15 heteroaryl group, L1 is a single bond, $(CR^aR^b)_p$, $(SiR^cR^d)_q$ (wherein $R^a$ to $R^d$ are each independently hydrogen, a halogen, a hydroxy group, a C1 to C10 alkyl group, a C1 to C10 fluoroalkyl group, or a C6 to C20 aryl group, and p and q are each independently integers ranging from 1 to 5), $S(=O)_2$, O, $C(=O)$, or a combination thereof, and n, m1, and m2 are each independently integers ranging from 0 to 2.

In Chemical Formula 1, the Cy1 of Chemical Formula 1 may include one of

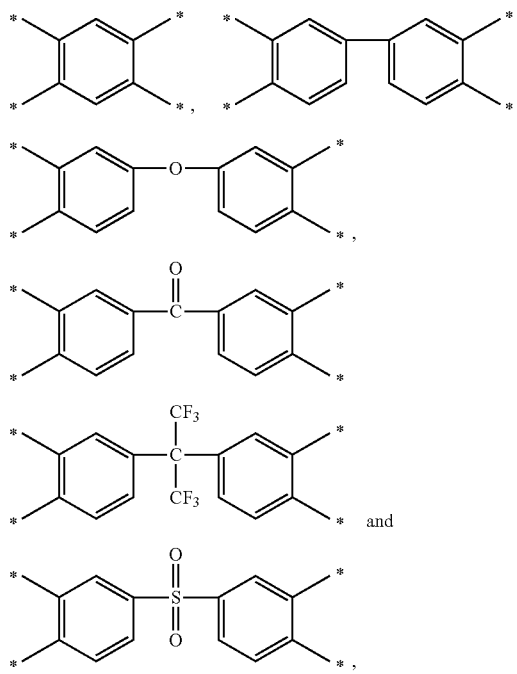

but example embodiments are not limited thereto.

In Chemical Formula 2, the Cy2 of Chemical Formula 2 may include one of

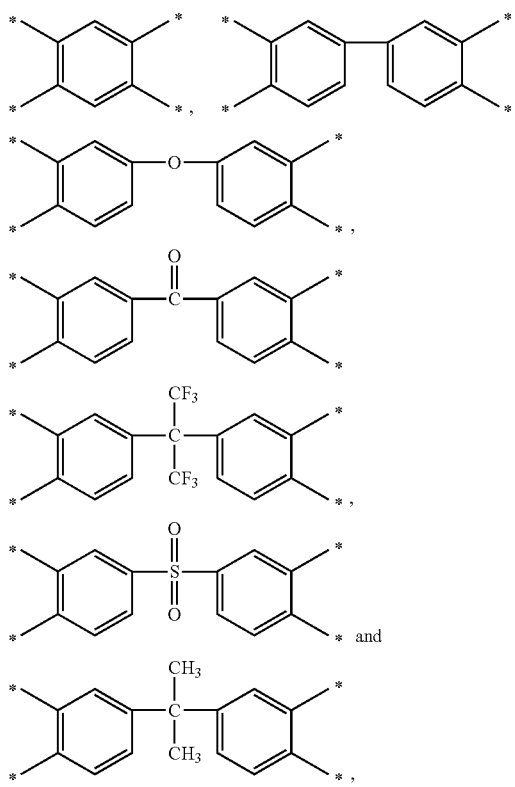

but example embodiments are not limited thereto.

The oligomer or polymer including structural units of the above Chemical Formulae 1 to 3 is a polyimide containing a hydroxyl group, and the cross-linking agent is a compound including two or more vinyl ether groups. The hydroxyl group of polyimide may be cured through the acetalization with the vinyl ether group of the cross-linking agent at a low temperature of less than about 130° C. Thereby, it may satisfy the low temperature process condition required for fabricating the flexible electronic device. In addition, when the passivation layer is provided on the organic semiconductor layer, it may provide a passivation layer without deteriorating the characteristics of the organic semiconductor since it may be dissolved in a solvent (e.g., water, alcohol, propylene glycol methyl ether acetate, etc.) that does not damage the organic semiconductor.

Chemical Formula 1 is a moiety induced from a dianhydride, and the structural units of Chemical Formula 2 and Chemical Formula 3 are moieties induced from a diamine. The structural units of Chemical Formula 2 and Chemical Formula 3 may be included in a mole ratio of about 50:50 to 90:10, for example, in a mole ratio of about 50:50 to 80:20. The structural unit of Chemical Formula 3 may improve the intermolecular interaction by having a linear structure. When the passivation layer is obtained from the oligomer or the polymer within the range, it may reduce (and/or minimize) electrical characteristic change to improve device reliability due to a dipolar interaction which autonomously occurs at the passivation layer even if the organic semiconductor layer is repeatedly exposed to the electric field for the long time.

Examples of the dianhydride may include compounds represented by the following Chemical Formula A.

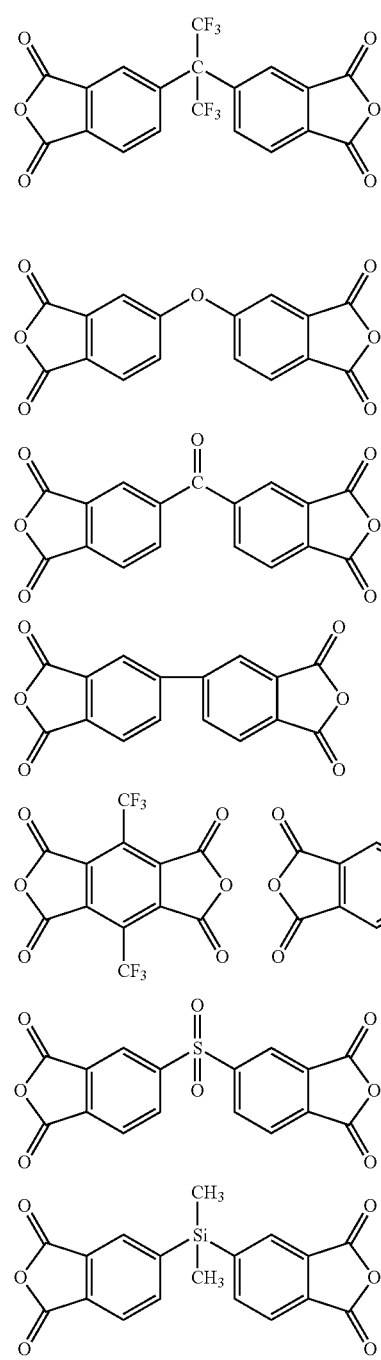

[Chemical Formula A]

The above Chemical Formula 2 may be selected from the following Chemical Formulae 5-1 and 5-2.

[Chemical Formula 5-1]

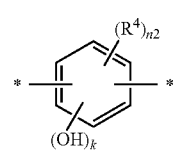

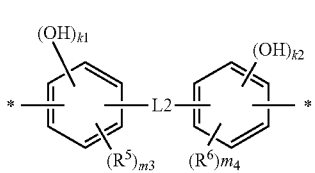

In Chemical Formulae 5-1 and 5-2, $R^4$ to $R^6$ are each independently hydrogen, a halogen (—F, —Cl, —Br, or —I), a substituted or unsubstituted C1 to C15 alkyl group, a substituted or unsubstituted C1 to C15 alkoxy group, a substituted or unsubstituted C1 to C15 fluoroalkyl group, a substituted or unsubstituted C3 to C15 cycloalkyl group, a substituted or unsubstituted C3 to C15 heterocycloalkyl group, a substituted or unsubstituted C3 to C15 cycloalkyloxy group, a substituted or unsubstituted C6 to C15 aryl group, a substituted or unsubstituted C6 to C15 aryloxy group, or a substituted or unsubstituted C2 to C15 heteroaryl group, L2 is a single bond, $(CR^aR^b)_p$, $(SiR^cR^d)_q$ (wherein $R^a$ to $R^d$ are each independently hydrogen, a halogen (—F, —Cl, —Br, or —I), a hydroxy group, a C1 to C10 alkyl group, a C1 to C10 fluoroalkyl group, or a C6 to C20 aryl group, and p and q are each independently integers ranging from 1 to 5), $S(=O)_2$, O, $C(=O)$, or a combination thereof, n2 is an integer ranging from 0 to 2, m3 and m4 are each independently integers ranging from 0 to 4, k and k1+k2 are each independently integers of 2 or more, and k1 and k2 are integers ranging from 0 to 4.

In Chemical Formulae 5-1 and 5-2, two linking groups may be connected to the main chain of a polymer or oligomer with each other at a meta position.

The above Chemical Formula 3 may be selected from the following Chemical Formulae 6-1 and 6-2.

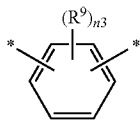

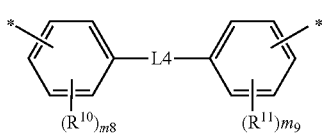

In Chemical Formulae 6-1 and 6-2, $R^9$ to $R^{11}$ are each independently hydrogen, a halogen (—F, —Cl, —Br, or —I), a substituted or unsubstituted C1 to C15 alkyl group, a substituted or unsubstituted C1 to C15 alkoxy group, a substituted or unsubstituted C1 to C15 fluoroalkyl group, a substituted or unsubstituted C3 to C15 cycloalkyl group, a substituted or unsubstituted C3 to C15 heterocycloalkyl group, a substituted or unsubstituted C3 to C15 cycloalkyloxy group, a substituted or unsubstituted C6 to C15 aryl group, a substituted or unsubstituted C6 to C15 aryloxy group, or a substituted or unsubstituted C2 to C15 heteroaryl group, L4 is a single bond, $(CR^aR^b)_p$, $(SiR^cR^d)_q$ (wherein $R^a$ to $R^d$ are each independently hydrogen, a halogen, a C1 to C10 alkyl group, a C1 to C10 fluoroalkyl group, or a C6 to C20 aryl group, and p and q are each independently integers ranging from 1 to 5), $S(=O)_2$, O, $C(=O)$, or a combination thereof, n3 is an integer ranging from 0 to 4, and m8 and m9 are each independently integers ranging from 0 to 4.

In Chemical Formulae 6-1 and 6-2, two linking groups may be connected to the main chain of a polymer or oligomer with each other at a meta position.

The above Chemical Formula 2 may be selected from the following Chemical Formula 7.

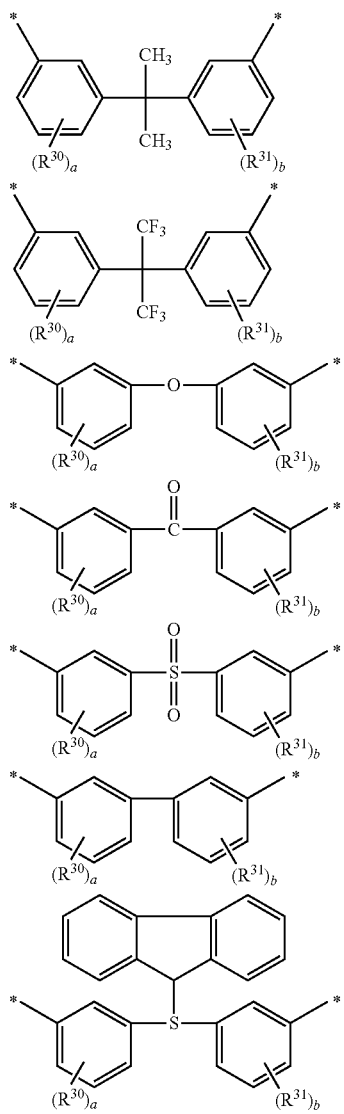

In Chemical Formula 7, $R^{30}$ and $R^{31}$ are each independently hydrogen, a hydroxy group, a halogen (—F, —Cl, —Br, or —I), a substituted or unsubstituted C1 to C15 alkyl group, a substituted or unsubstituted C1 to C15 alkoxy group, a substituted or unsubstituted C1 to C15 fluoroalkyl group, a substituted or unsubstituted C3 to C15 cycloalkyl group, a substituted or unsubstituted C3 to C15 heterocycloalkyl group, a substituted or unsubstituted C3 to C15 cycloalkyloxy group, a substituted or unsubstituted C6 to C15 aryl group, a substituted or unsubstituted C6 to C15 aryloxy group, or a substituted or unsubstituted C2 to C15 heteroaryl group, provided that at least two of $R^{30}$ and $R^{31}$ are a hydroxy group, a and b each independently range from 0 to 4, and a+b is 2 or more.

The above Chemical Formula 2 may be derived from one of diamines represented by the following Chemical Formula B.

[Chemical Formula B]

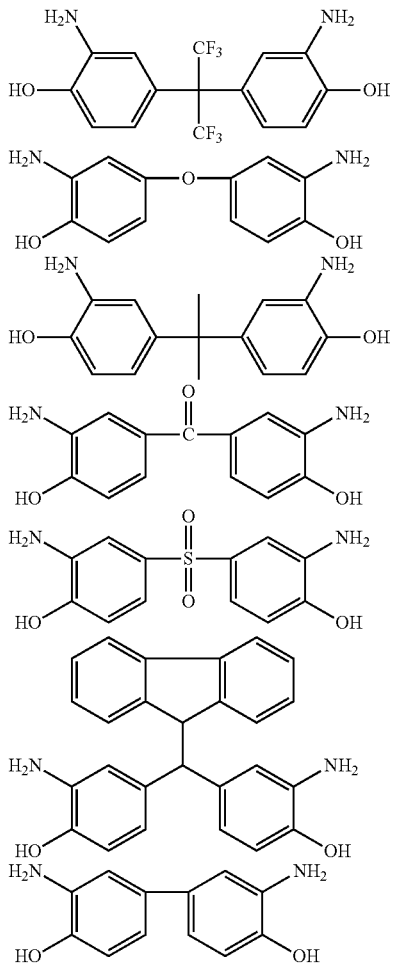

In Chemical Formula 3, Cy3 does not include a hydroxy group, and Chemical Formula 3 may be any one of the following Chemical Formula 8.

[Chemical Formula 8]

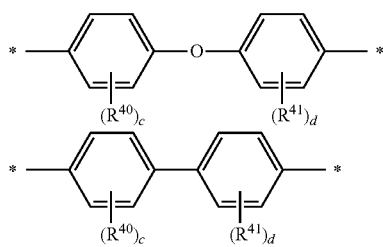

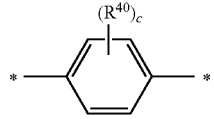

-continued

In Chemical Formula 8, $R^{40}$ and $R^{41}$ are each independently hydrogen, a halogen (—F, —Cl, —Br, or —I), a substituted or unsubstituted C1 to C15 alkyl group, a substituted or unsubstituted C1 to C15 alkoxy group, a substituted or unsubstituted C1 to C15 fluoroalkyl group, a substituted or unsubstituted C3 to C15 cycloalkyl group, a substituted or unsubstituted C3 to C15 heterocycloalkyl group, a substituted or unsubstituted C3 to C15 cycloalkyloxy group, a substituted or unsubstituted C6 to C15 aryl group, a substituted or unsubstituted C6 to C15 aryloxy group, or a substituted or unsubstituted C2 to C15 heteroaryl group, and do not include a hydroxy group, c and d each independently range from 0 to 4, and c+d is 2 or more.

The above Chemical Formula 3 may be derived from one of diamines represented by the following Chemical Formula C.

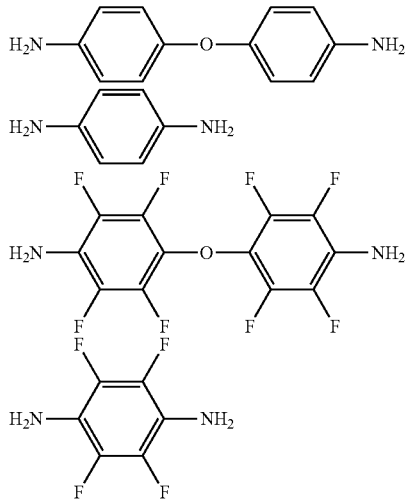

The structural unit of the above Chemical Formula 1 may include structural units represented by the following Chemical Formulae 9 and 10. The structural unit of Chemical Formula 9 includes a cyclic group that is not substituted with a fluoro group or a fluoroalkyl group, and the structural unit of Chemical Formula 10 includes a cyclic group that is substituted with a fluoro group or a fluoroalkyl group.

[Chemical Formula 9]

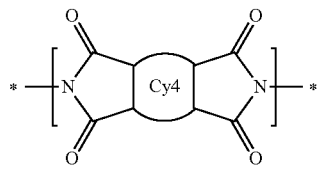

In Chemical Formula 9,

Cy4 is selected from a substituted or unsubstituted C4 to C20 carbocyclic group, a substituted or unsubstituted C6 to C20 monocyclic aromatic group, a substituted or unsubstituted C2 to C20 condensed polycyclic aromatic group, and a C2 to C20 non-condensed polycyclic aromatic group, and is a cyclic group unsubstituted with at least one fluoro group or at least one C1 to C15 fluoroalkyl group.

[Chemical Formula 10]

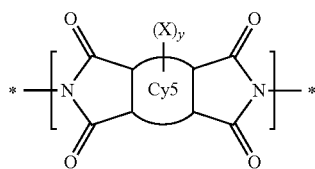

In Chemical Formula 10, Cy5 is selected from a substituted or unsubstituted C4 to C20 carbocyclic group, a substituted or unsubstituted C6 to C20 monocyclic aromatic group, a substituted or unsubstituted C2 to C20 condensed polycyclic aromatic group, and a C2 to C20 non-condensed polycyclic aromatic group, X is a fluoro group or a C1 to C15 fluoroalkyl group, and y is determined by a valence of Cy5 and is an integer ranging from 1 to 4.

Cy4 of the above Chemical Formula 9 may be one of the following Chemical Formulae 9-1 and 9-2.

[Chemical Formula 9-1]

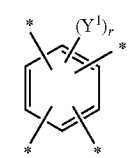

[Chemical Formula 9-2]

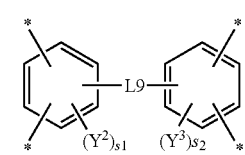

In Chemical Formulae 9-1 and 9-2, $Y^1$ to $Y^3$ are each independently hydrogen, a hydroxy group, a substituted or unsubstituted C1 to C15 alkyl group, a substituted or unsubstituted C1 to C15 alkoxy group, a substituted or unsubstituted C3 to C15 cycloalkyl group, a substituted or unsubstituted C3 to C15 heterocycloalkyl group, a substituted or unsubstituted C3 to C15 cycloalkyloxy group, a substituted or unsubstituted C6 to C15 aryl group, a substituted or unsubstituted C6 to C15 aryloxy group, or a substituted or unsubstituted C2 to C15 heteroaryl group, L9 is a single bond, $(CR^aR^b)_p$, $(SiR^cR^d)_q$ (wherein $R^a$ to $R^d$ are each independently hydrogen, a hydroxy group, a C1 to C10 alkyl group, or a C6 to C20 aryl group, and p and q are each independently integers ranging from 1 to 5), $S(=O)_2$, O, $C(=O)$, or a combination thereof, and r, s1, and s2 are each independently integers ranging from 0 to 2.

Cy5 of the above Chemical Formula 10 may be one of the following Chemical Formulae 10-1 and 10-2.

[Chemical Formula 10-1]

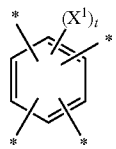

[Chemical Formula 10-2]

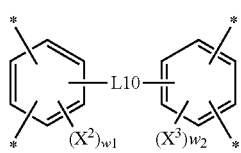

In Chemical Formulae 10-1 and 10-2, $X^1$ to $X^3$ are each independently a fluoro group or a C1 to C15 fluoroalkyl group, L10 is a single bond, $(CR^aR^b)_p$, $(SiR^cR^d)_q$ (wherein $R^a$ to $R^d$ are each independently hydrogen, a halogen (—F, —Cl, —Br, or —I), a hydroxy group, a C1 to C10 alkyl group, a C1 to C10 fluoroalkyl group, or a C6 to C20 aryl group, and p and q are each independently integers ranging from 1 to 5), $S(=O)_2$, O, $C(=O)$, or a combination thereof, and t, w1, and w2 are each independently integers ranging from 0 to 2.

Each C6 aromatic ring of the above Chemical Formulae 10-1 and 10-2 is substituted with a substituent selected from a C1 to C15 alkyl group, a substituted or unsubstituted C1 to C15 alkoxy group, a substituted or unsubstituted C3 to C15 cycloalkyl group, a substituted or unsubstituted C3 to C15 heterocycloalkyl group, a substituted or unsubstituted C3 to C15 cycloalkyloxy group, a substituted or unsubstituted C6 to C15 aryl group, a substituted or unsubstituted C6 to C15 aryloxy group, and a substituted or unsubstituted C2 to C15 heteroaryl group.

The structure unit of Chemical Formula 10 may be included at about 50 mol % or less, for example, about 5 mol % to about 30 mol %, based on a total of 100 mol % of the structural units of Chemical Formula 9 and Chemical Formula 10. Within the range, it may improve the water repellency and dissolubility of the oligomer and polymer by associating the structural unit represented by Chemical Formula 9 and the structural unit represented by Chemical Formula 10.

The cross-linking agent is a compound having two or more vinyl ether groups.

Examples of the cross-linking agent may include 2,2'-bis (4-(2-(vinyloxy)ethoxy)phenyl)propane (BPA-DEVE), (1,1, 1-tris(4-2-(vinyloxy)ethoxy)phenyl)ethane, 1,3,5-tris(2-(vinyloxy)ethoxy)benzene, poly(ethylene glycol)divinyl ether, 4,4'-bis-but-3-enyloxy-biphenyl, 1,5-bis-but-3-enyloxy-naphthalene, or a mixture thereof.

When the diamine inducing the structural unit of the above Chemical Formula 2 is 2,2'-bis(3-amino-4-hydroxyphenyl) hexafluoropropane, and the cross-linking agent is 2,2'-bis(4-(2-(vinyloxy)ethoxy)phenyl)propane, the cross-linking reaction of a hydroxy group and vinyl ether is illustrated in the following Reaction Scheme 1.

[Reaction Scheme 1]

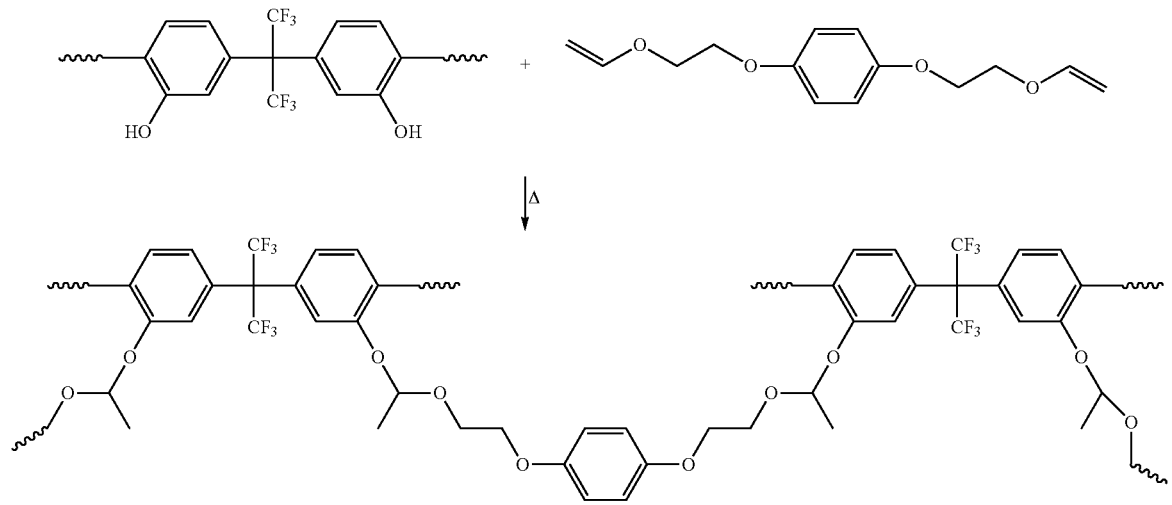

The organic passivation layer composition may further include a solvent to improve the coating property. Examples of the solvent may include water, alcohol (methanol, ethanol, isopropanol, etc.), propylene glycol methyl ether acetate, or the like.

In an organic passivation layer composition according to example embodiments, the amount of oligomer or polymer including the structural units of Chemical Formulae 1 to 3 is not specifically limited. For example, the oligomer or polymer may be included in the amount of about 5 to about 60 wt %. Within the range, it may provide a passivation layer that easily controls the viscosity of the composition and has excellent smoothness.

The amount of the cross-linking agent may be determined by the amount of hydroxyl group present in the structural unit of Chemical Formula 2, since the cross-linking functional group of the cross-linking agent is reacted with a hydroxyl group at a mole ratio of about 1:0.75 to 1:1.25, for example, at a mole ratio of about 1:1.

The organic passivation layer composition may further include a photoacid generator (PAG) to provide photosensitivity. The photoacid generator may include triarylsulfonium perfluoroalkyl sulfonate, triarylsulfonium triflate, diaryliodonium triflate, triarylsulfonium nonaflate, diaryliodonium nonaflate, succinimidyl triflate, 2,6-dinitrobenzyl sulfonate, or a combination thereof. Herein, the alkyl may be a C1 to C10 alkyl, and the aryl may be a C6 to C18 aryl. The photoacid generator may be included at about 1 to about 15 parts by weight based on 100 parts by weight of the oligomer or polymer including the structural units of Chemical Formulae 1 to 3.

According to example embodiments, an organic passivation mixture includes a glycol solvent and an organic passivation composition including an oligomer or a polymer including structural units represented by the above Chemical Formulae 1 and 2, and a cross-linking agent having two or more vinyl ether groups.

The glycol solvent may include propylene glycol methyl ether acetate.

The Cy1 of the above Chemical Formula 1 may include one of the above Chemical Formulae 4-1 and 4-2.

The Chemical Formula 2 may include one of the above Chemical Formulae 5-1 and 5-2.

The oligomer or polymer of the organic passivation mixture may include a structural unit represented by the following Chemical Formula 11,

[Chemical Formula 11]

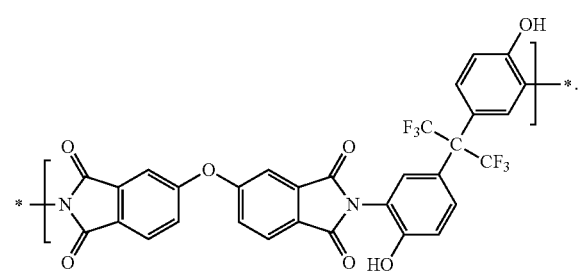

An organic passivation layer may be fabricated from the organic passivation mixture.

The oligomer or polymer of the organic passivation mixture may further include a structural unit represented by the above Chemical Formula 3. The Chemical Formula 3 may include one of the above Chemical Formulae 6-1, 6-2, and 8.

According to example embodiments, an organic passivation composition may include an oligomer or polymer including a first structural unit including at least one of structural units represented by the following Chemical Formulae 11 and 12 and a second structural unit including at least one of structural units represented by the following Chemical Formulae 13 and 14:

[Chemical Formula 11]

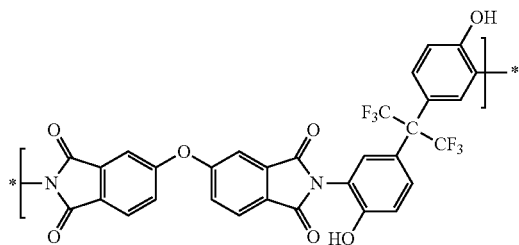

[Chemical Formula 12]

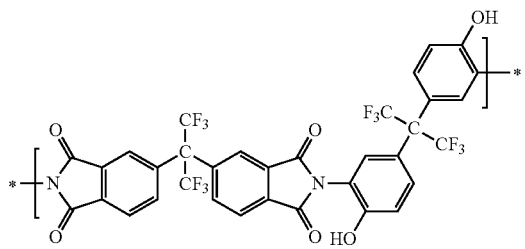

[Chemical Formula 13]

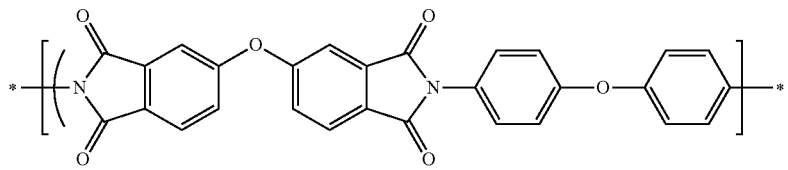

[Chemical Formula 14]

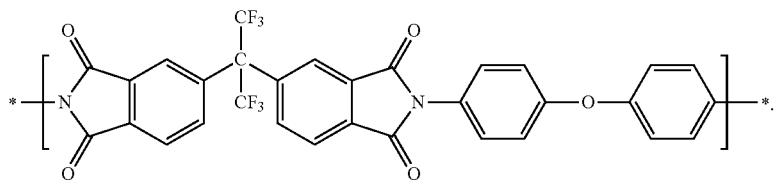

The first and second structural units may be arranged randomly in the oligomer or the polymer.

The oligomer or polymer may include more structural units represented by Chemical Formula 11 than Chemical Formula 13, more structural units represented by Chemical Formula 13 than Chemical Formula 12, and more structural units represented by Chemical Formula 12 than Chemical Formula 14.

The mole ratio of structural units represented by Chemical Formula 11 to Chemical Formula 12 may be about 2:1 to about 4:1, and specifically about 3:1.

According to example embodiments, an organic thin film transistor includes the passivation layer obtained from the organic passivation layer composition. The organic thin film transistor (OTFT) may generally include a substrate, a gate electrode, a gate insulating layer, a source electrode, a drain electrode, and an organic semiconductor layer, but the layer structure is not specifically limited.

Hereinafter, organic thin film transistors according to example embodiments are described with reference to FIGS. 1A, 1B, 2A and 2B.

Figure 1B:
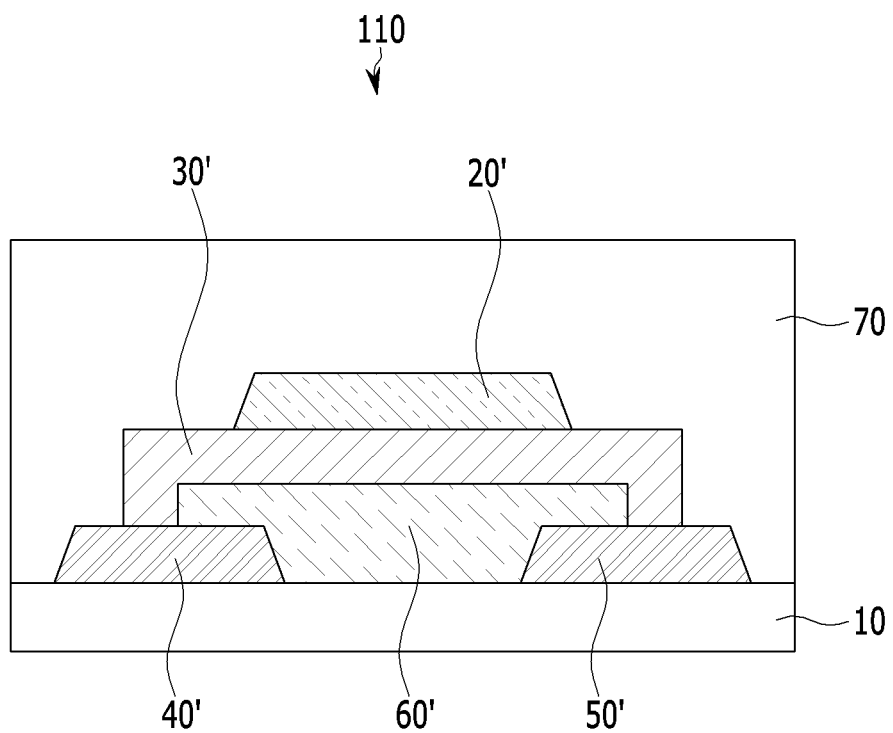
FIG. 1B is a schematic cross-sectional view of an organic thin film transistor having a bottom-contact and top-gate structure according to example embodiments.
Figure 2A:
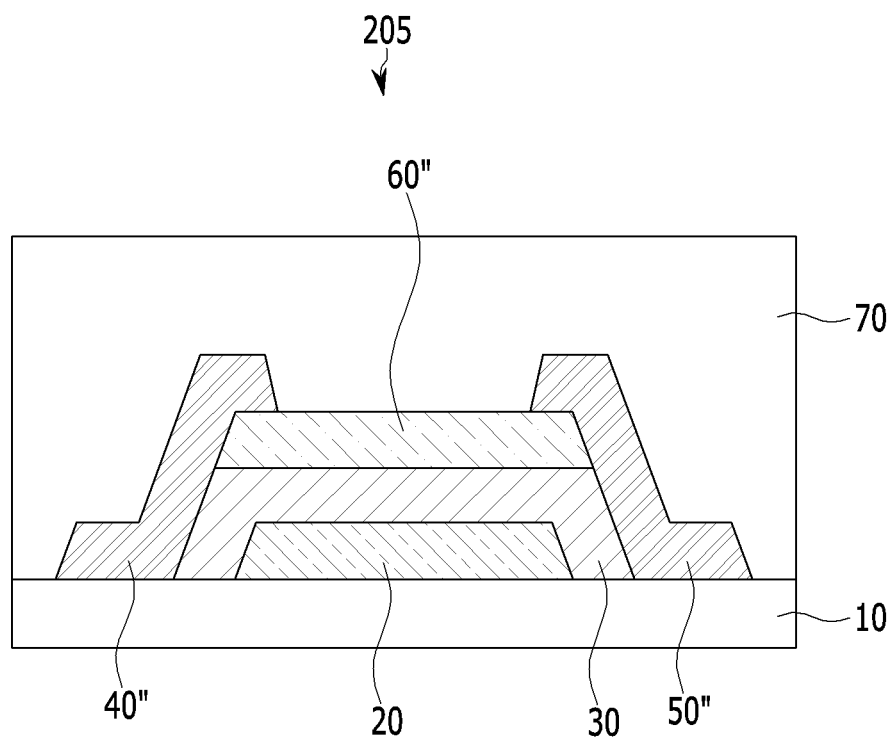
FIG. 2A is a schematic cross-sectional view of an organic thin film transistor having a top-contact and bottom-gate structure according to example embodiments.
Figure 2B:
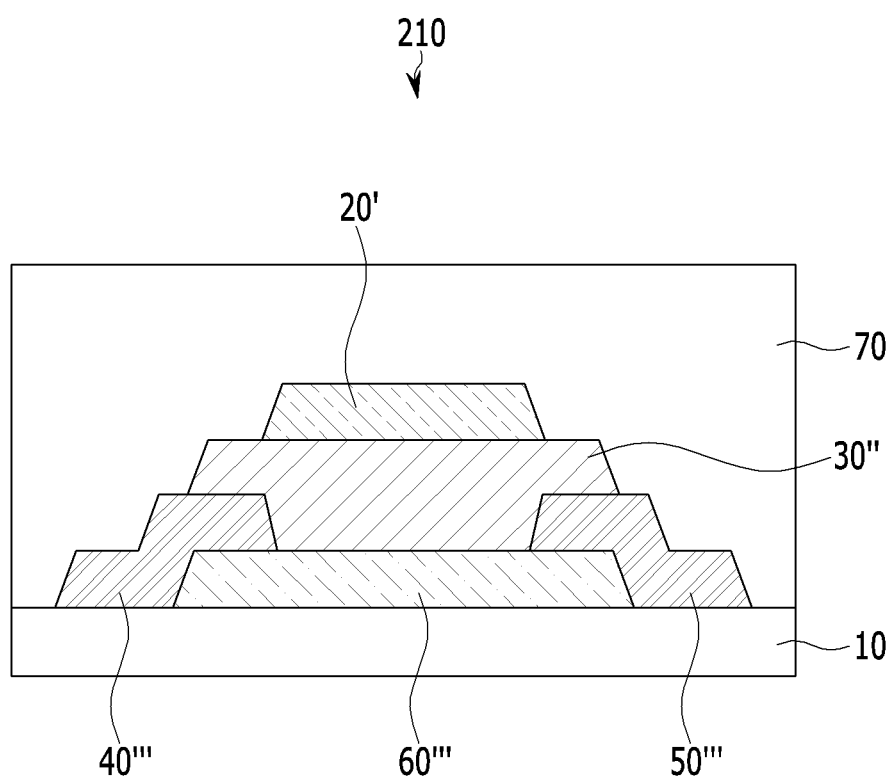
FIG. 2B is a schematic cross-sectional view of an organic thin film transistor having a top-contact and top-gate structure according to example embodiments.

FIG. 1A is schematic cross-sectional view of an organic thin film transistor having a bottom-contact and bottom-gate structure according to example embodiments. FIG. 1B is a schematic cross-sectional view of an organic thin film transistor having a bottom-contact and top-gate structure according to example embodiments. FIG. 2A is a schematic cross-sectional view of an organic thin film transistor having a top-contact and bottom-gate structure according to example embodiments. FIG. 2B is a schematic cross-sectional view of an organic thin film transistor having a top-contact and top-gate structure according to example embodiments.

As shown in FIG. 1A, an organic thin film transistor 105 according to example embodiments may have a bottom-contact (BC) and bottom-gate structure in which an organic semiconductor layer 60 is disposed on a source electrode 40 and a drain electrode 50 by orderly laminating a gate electrode 20, a gate insulating layer 30, the source electrode 40, the drain electrode 50, and the organic semiconductor layer 60 on a substrate 10.

As shown in FIG. 1B, an organic thin film transistor 110 according to example embodiments may have a bottom contact (BC) and top-gate structure in which an organic semiconductor layer 60' is disposed on a source electrode 40' and a drain electrode 50' on a substrate 10. A gate insulating layer 30' is formed over the source electrode 40', the organic semiconductor layer 60', and the drain electrode. 50'. A gate electrode 20' is formed on the gate insulating layer 30'.

As shown in FIG. 2A, an organic thin film transistor 205 according to example embodiments may have a top-contact (TC) and bottom-gate structure in which a metal electrode is disposed on the organic semiconductor layer 60" by a mask deposition process or the like. The organic thin film transistor 205 includes a gate electrode 20, the gate insulating layer 30, and an organic semiconductor layer 60" in between a source electrode 40" and a drain electrode 50" on the substrate 10.

As shown in FIG. 2B, an organic thin film transistor 210 according to example embodiments may have a top contact (TC) and top-gate structure in which an organic semiconductor layer 60''' is disposed on a substrate 10, and a source electrode 40''' and a drain electrode 50''' are disposed on the substrate 10 and the organic semiconductor layer 60". A gate insulating layer 30" is disposed on the source electrode 40''', the organic semiconductor layer 60''', and the drain electrode 50'''. A gate electrode 20' is on the gate insulating layer 30".

The substrate 10 may be formed of glass, polyethylene naphthalate (PEN), polyethylene terephthalate (PET), polycarbonate, polyvinylbutyral, polyacrylate, polyimide, polynorbornene, polyethersulfone (PES), but example embodiments are not limited thereto.

The gate electrode 20 (20'), the source electrode 40 (40', 40", 40'''), and the drain electrode 50 (50', 50", 50''') may include generally-used metals, for example, gold (Au), silver (Ag), aluminum (Al), nickel (Ni), molybdenum (Mo), tungsten (W), transparent conductive oxide such as indium tin oxide (ITO) or the like, but example embodiments are not limited thereto.

The gate insulating layer 30 may include an inorganic insulator such as silicon oxide ($SiO_2$), silicon nitride ($SiN_x$), or the like, or an organic insulator such as polyimide, benzocyclobutene, parylene, polyacrylate, polyvinylbutyral, polyvinylphenol, or the like, but example embodiments are not limited thereto.

In the organic thin film transistors 110 and 210 having a top-gate structure, as shown in FIGS. 1B and 2B, a non-plasma process may be used to apply the gate insulating layer 30' (30") in order to limit (and/or prevent) damage to the organic semiconductor layers 60' and 60'". Organic insulators such as polyimide, benzocyclobutene, Parylene, polyacrylate, polyvinylbutyral, polyvinylphenol, or the like may be used for the gate insulating layer 30' (30"), but example embodiments are not limited thereto.

The organic semiconductor layer 60, 60', 60", and 60'" may include generally-used materials, for example, pentacene, copper phthalocyanine, polythiophene, polyaniline, polyacetylene, polypyrrole, polyphenylene vinylene, or derivatives thereof, but example embodiments are not limited thereto.

The organic thin film transistors 105 and 205 having the bottom-gate structure include an organic passivation layer 70 on the organic semiconductor layer 60 (60") in order to improve the electrical characteristics of a device and to improve long-term reliability. The organic passivation layer 70 is obtained from the organic passivation layer composition according to example embodiments.

The organic thin film transistors 110 and 210 having the top-gate structure include the organic passivation layer 70 over the stack containing the gate electrode 20', source electrode 40' (40'"), organic semiconductor layer 60' (60"), gate insulating layer 30' (30") and drain electrode 50' (50"). The organic passivation layer 70 is obtained from the organic passivation layer composition according to example embodiments.

Alternatively, for the organic thin film transistors 110 and 210 having the top-gate structure, the organic passivation layer composition according to example embodiments may also be substituted for a material of the gate insulating layer 30' (30") and used for the organic passivation layer 70. As such, for organic thin film transistors 110 and 210 having the top-gate structure, the organic passivation layer composition according to example embodiments may act as both a gate insulating layer 30' (30") and an organic passivation layer 70.

While organic thin film transistors have been described with reference to FIGS. 1A, 1B, 2A, and 2B, organic thin film transistors according to example embodiments are not limited to the structures shown in FIGS. 1A, 1B, 2A, and 2B.

The organic passivation layer of the organic thin film transistor according to example embodiments may be provided by screen printing, printing, dipping, ink-spraying, or laser deposition besides the spin coating to provide a thin film.

The organic thin film transistor may be applied to various devices such as a plastic smart card, a plastic chip for an inventory tag, a solar cell, a memory device, an organic light emitting diode (OLED), a photosensor, a laser device, or the like.

Hereinafter, solar cells and a solar cell module according to example embodiments are described with reference to FIGS. 3A to 3C.

Figure 3A:
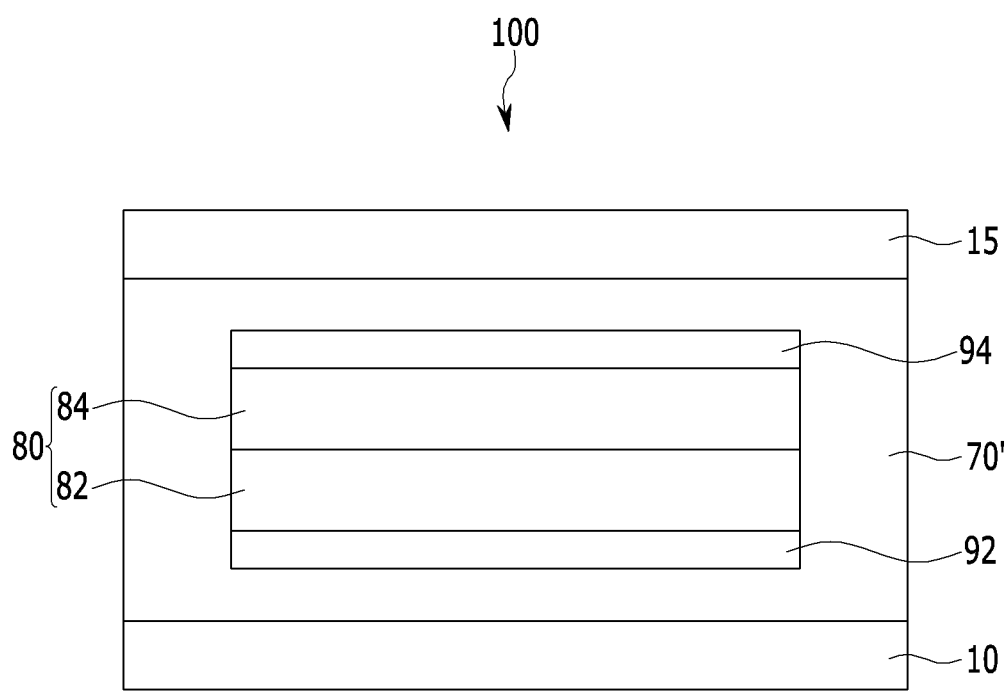
FIGS. 3A and 3B are schematic cross-sectional views of solar cells according to example embodiments.
Figure 3B:
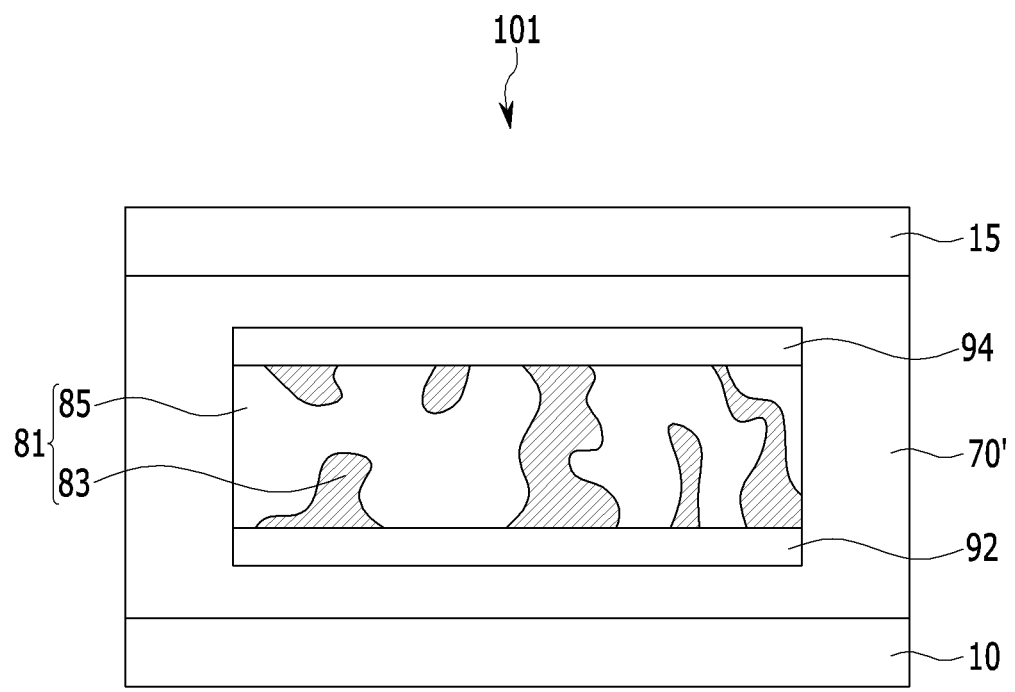

FIGS. 3A and 3B are schematic cross-sectional views of solar cells according to example embodiments. FIG. 3C is a schematic cross-sectional view of a solar cell module according to example embodiments. The description of like elements previously described will be omitted.

As shown in FIG. 3A, a solar cell 100 according to example embodiments includes a substrate 10, a cover 15, and an organic photoactive layer 80 between a pair of electrodes 92 and 94. An organic passivation layer 70' may surround the organic photoactive layer 80 and pair of electrodes 92 and 94, in between the substrate 10 and the cover 15. The organic photoactive layer 80 includes a bi-layer structure containing an electron acceptor 82 and an electron donor 84. While FIG. 3A illustrates an electron donor 84 on the electron acceptor 82, the positions of the electron donor 84 and the electron acceptor 82 may alternatively be reversed so the electron acceptor 82 is on the electron donor 84.

As shown in FIG. 3B, a solar cell 101 according to example embodiments may include the same features as the solar cell 100 in FIG. 3A, except the organic photoactive layer 81 illustrated in FIG. 3B differs in structure compared to the organic photoactive layer 80 illustrated in FIG. 3A. As shown in FIG. 3B, the organic photoactive layer 81 may include a bulk heterojunction structure containing an electron donor 85 intermixed with an electron acceptor 83.

Figure 3C:
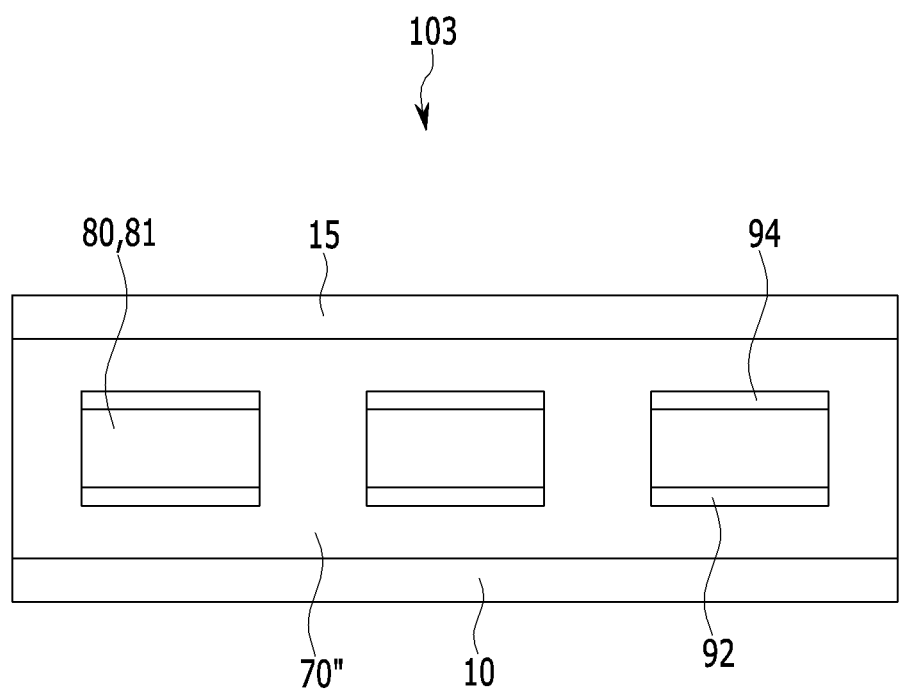
FIG. 3C is a schematic cross-sectional view of a solar cell module according to example embodiments.

As shown in FIG. 3C, a solar cell module 103 according to example embodiments may include a plurality of organic photoactive layers 80 and 81 between pairs of electrodes 92 and 94. The plurality of organic photoactive layers 80 and 81 between pairs of electrodes 92 and 94 are surrounded by an organic passivation layer 70", and may be electrically connected to each other in series, parallel, and/or series-parallel with wires (not shown) in order to achieve the desired power output.

The cover 15 may be formed of glass, polyethylene naphthalate (PEN), polyethylene terephthalate (PET), polycarbonate, polyvinylbutyral, polyacrylate, polyimide, polynorbornene, polyethersulfone (PES), or the like, without limitation, but example embodiments are not limited thereto. The cover 15 and the substrate 10 may include the same or different materials.

The electrodes 92 and 94 may include electrically conductive materials, for example transparent conductive oxides such as indium tin oxide (ITO), but example embodiments are not limited thereto. One of the electrodes 92 and 94 may include a metal, for example gold (Au), silver (Ag), aluminum (Al), nickel (Ni), indium tin oxide (ITO), molybdenum (Mo), tungsten (W), but example embodiments are not limited thereto.

Materials for the electron acceptors 82 and 83 and electron donors 84 and 85 of the organic photoactive layers 80 and 81 may include generally-used materials, for example, at least two of pentacene, copper phthalocyanine, polythiophene, polyaniline, polyacetylene, polypyrrole, polyphenylene vinylene, or derivatives thereof, but example embodiments are not limited thereto.

The organic passivation layers 70' and 70" are obtained from the organic passivation layer composition according to example embodiments.

Hereinafter, this disclosure is illustrated in more detail with reference to non-limiting examples, but example embodiments are not limited to the following examples.

Example 1

About 10.0 g of 4,4'-oxydiphthalic anhydride and about 11.80 g of 2,2'-bis(3-amino-4-hydroxyphenyl)hexafluoropropane are polymerized to provide polyhydroxyimide (Mn=1,097) including the structural unit of the following Chemical Formula 11. About 1 g of polyhydroxyimide including the structural unit of the following Chemical Formula 11 is dissolved in a propylene glycol methyl ether acetate solvent to provide a polyhydroxyimide solution having solid content of 15 wt %. Then about 0.547 g of a cross-linking agent of 2,2'-bis(4-(2-(vinyloxy)ethoxy)phenyl)propane is added thereto, and is mixed and filtered using a filter with pore size of about 0.45 μm to provide an organic passivation layer composition.

[Chemical Formula 11]

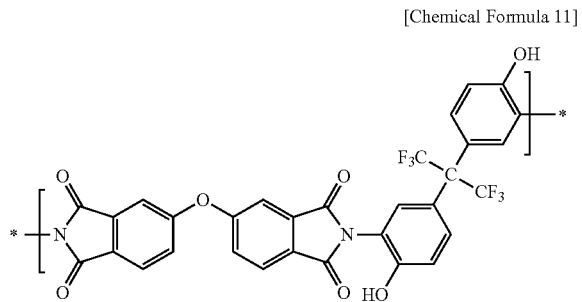

Molybdenum for a gate electrode is deposited on a cleaned glass substrate at about 1000 Å according to a sputtering method, and a $SiO_2$ insulation layer is formed according to CVD process at a thickness of about 300 nm. A solution in which a polymer semiconductor of polythiophene is dissolved in chlorobenzene at about 1 wt % is coated at about 1000 rpm for about 30 seconds according to a spin coating method, and is heated at about 100° C. for about 10 minutes to provide an organic semiconducting layer having a thickness of about 500 Å. Gold (Au) for a source-drain electrode is deposited to about 70 nm according to a sputtering method. The organic passivation layer composition is spin-coated thereon and cured at about 130° C. for about 2 hours under a vacuum condition to provide an organic thin film transistor formed with the organic passivation layer of 1 μm.

Example 2

About 10.0 g of 4,4'-oxydiphthalic anhydride, about 9.44 g of of 2,2'-bis(3-amino-4-hydroxyphenyl)hexafluoropropane, and 1.29 g of 4,4'-oxydianiline are polymerized to provide polyhydroxyimide (Mn=1,467) including the structural unit of the above Chemical Formula 11 and the structural unit of the following Chemical Formula 13. About 1.1 g of polyhydroxyimide including the structural unit of the above Chemical Formula 11 and the structural unit of the following Chemical Formula 13 is dissolved in a propylene glycol methyl ether acetate solvent to provide a polyhydroxyimide solution having solid content of 15 wt %. Then about 0.535 g of a cross-linking agent of 2,2'-bis(4-(2-(vinyloxy)ethoxy)phenyl)propane is added thereto, and is mixed and filtered using a filter with pore size of about 0.45 μm to provide an organic passivation layer composition.

[Chemical Formula 13]

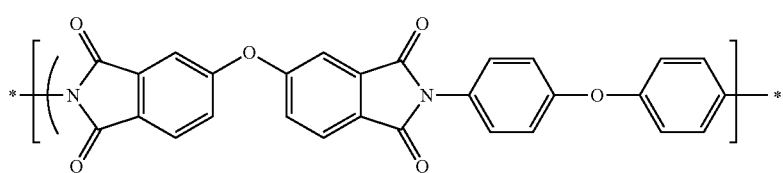

A mole ratio of the structural units of Chemical Formula 11 and Chemical Formula 12 is 4:1.

Using the passivation layer composition, an organic thin film transistor is fabricated according to the same method as in Example 1.

Example 3

About 8.0 g of 4,4'(hexafluoroisopropylene)diphthalic anhydride, 2.86 g of 4,4'-oxydiphthalic anhydride, about 9.44 g of of 2,2'-bis(3-amino-4-hydroxyphenyl)hexafluoropropane, and 1.29 g of 4,4'-oxydianiline are polymerized to provide polyhydroxyimide (Mn=2,181) including the structural units of the above Chemical Formulae 11 and 13 and the structural units of the following Chemical Formulae 12 and 14. About 1.1 g of polyhydroxyimide including the structural units of the above Chemical Formulae 11 and 13 and the structural units of the following Chemical Formulae 12 and 14 is dissolved in a propylene glycol methyl ether acetate solvent to provide a polyhydroxyimide solution having solid content of 15 wt %. Then about 0.511 g of a cross-linking agent of 2,2'-bis(4-(2-(vinyloxy)ethoxy)phenyl)propane is added thereto, and is mixed and filtered using a filter with pore size of about 0.45 μm to provide an organic passivation layer composition.

[Chemical Formula 12]

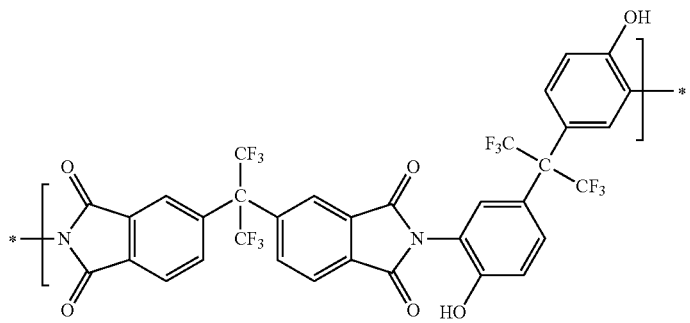

[Chemical Formula 14]

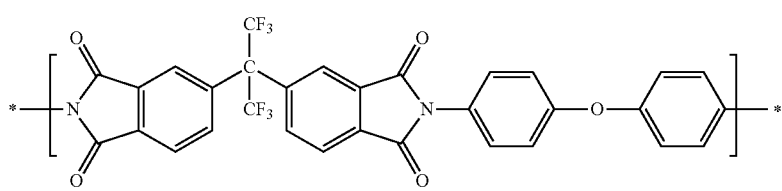

A mole ratio of the structural units of Chemical Formulae 11 to 14 is 16:4:4:1.

Using the passivation layer composition, an organic thin film transistor device is fabricated according to the same method as in Example 1.

Comparative Example 1

An organic thin film transistor is fabricated in accordance with the same procedure as in Example 1, except the organic passivation layer is not provided.

Evaluation of Electric Characteristics of Organic Thin Film Transistor

Figure 4:
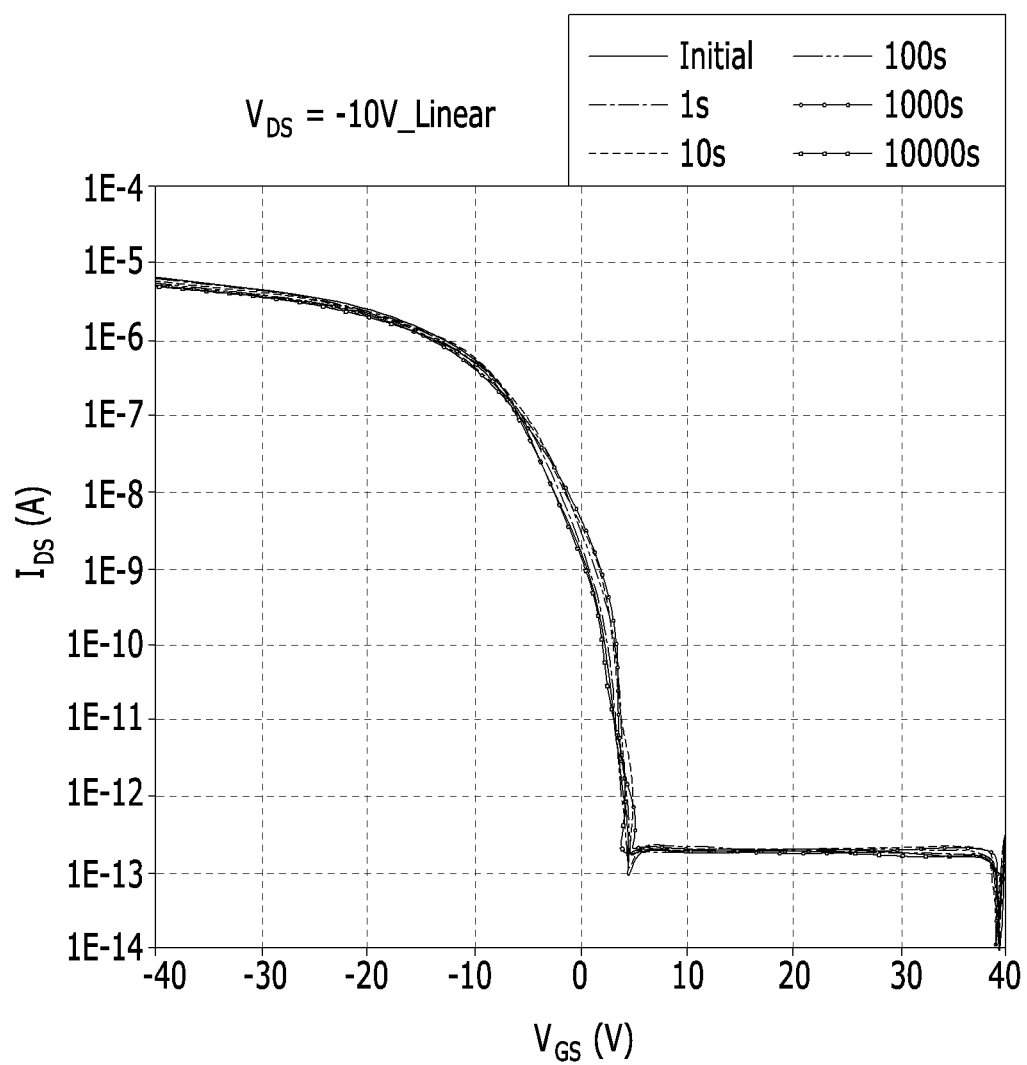
FIGS. 4 and 5 are respectively graphs showing current transfer characteristics measured in a linear region ($V_{DS}=-10V$) and a saturation region ($V_{DS}=-40V$) of the organic thin film transistor according to Example 1.
Figure 5:
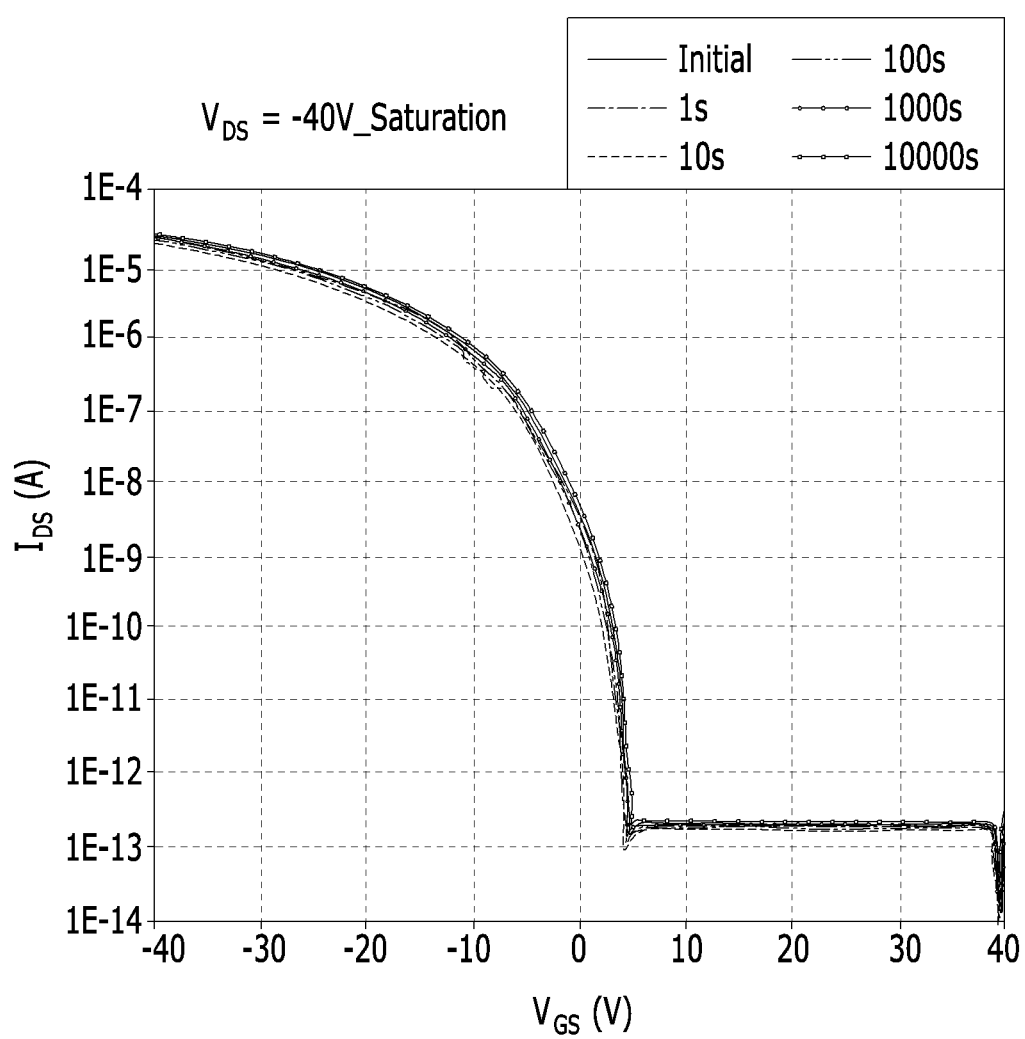
Figure 6:
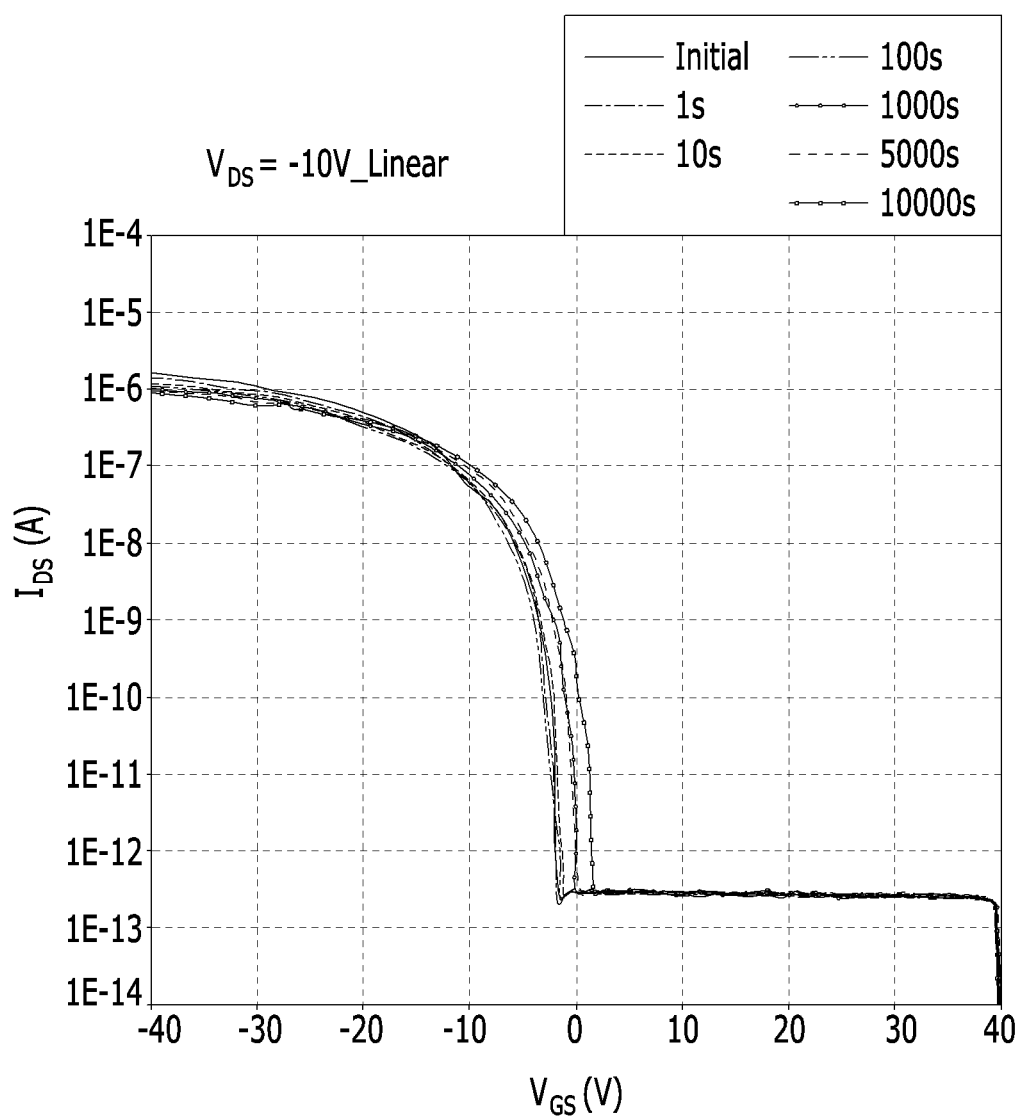
FIGS. 6 and 7 are respectively graphs showing current transfer characteristics measured in a linear region ($V_{DS}=-10V$) and a saturation region ($V_{DS}=-40V$) of the organic thin film transistor according to Example 2.
Figure 7:
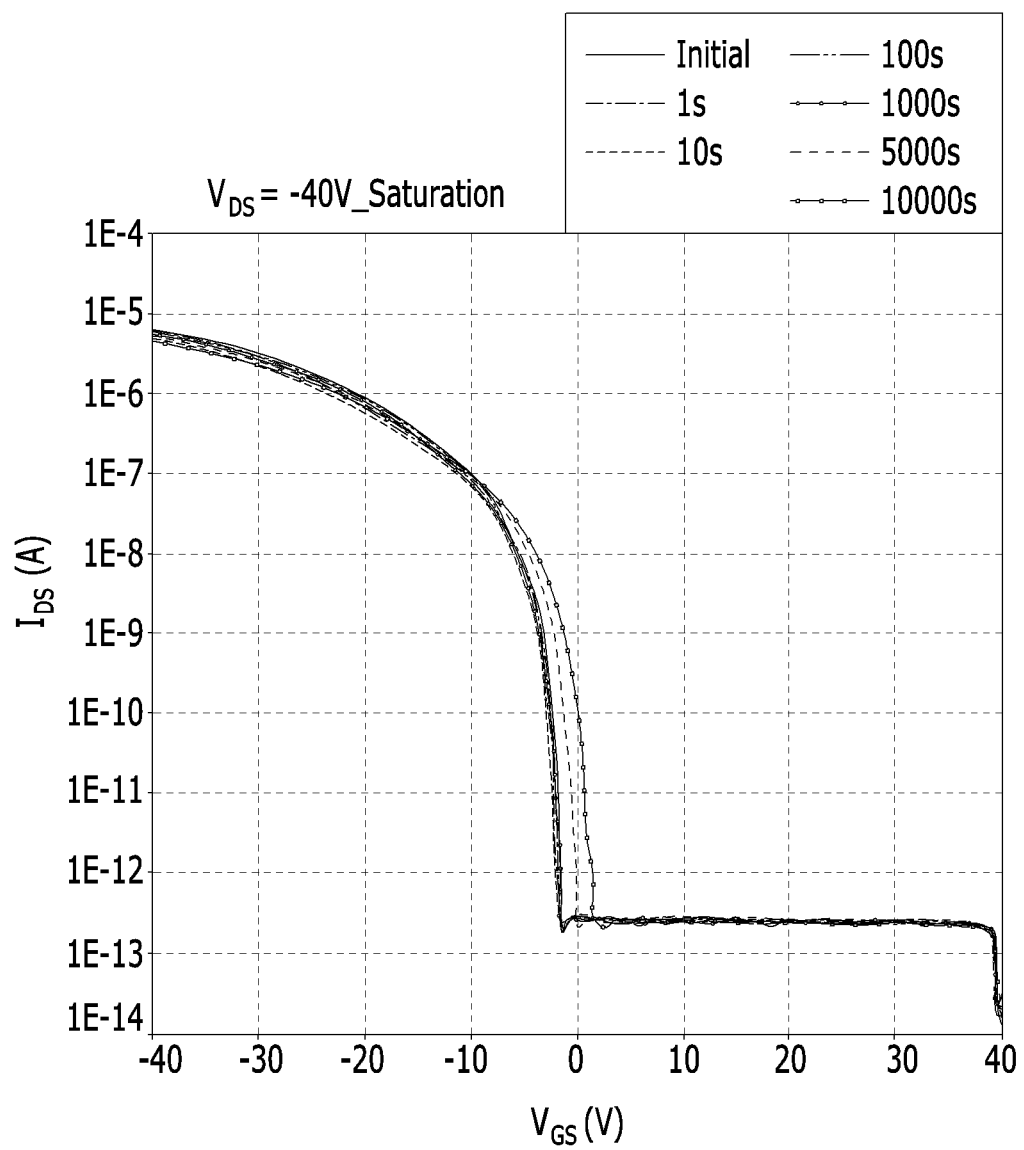
Figure 8:
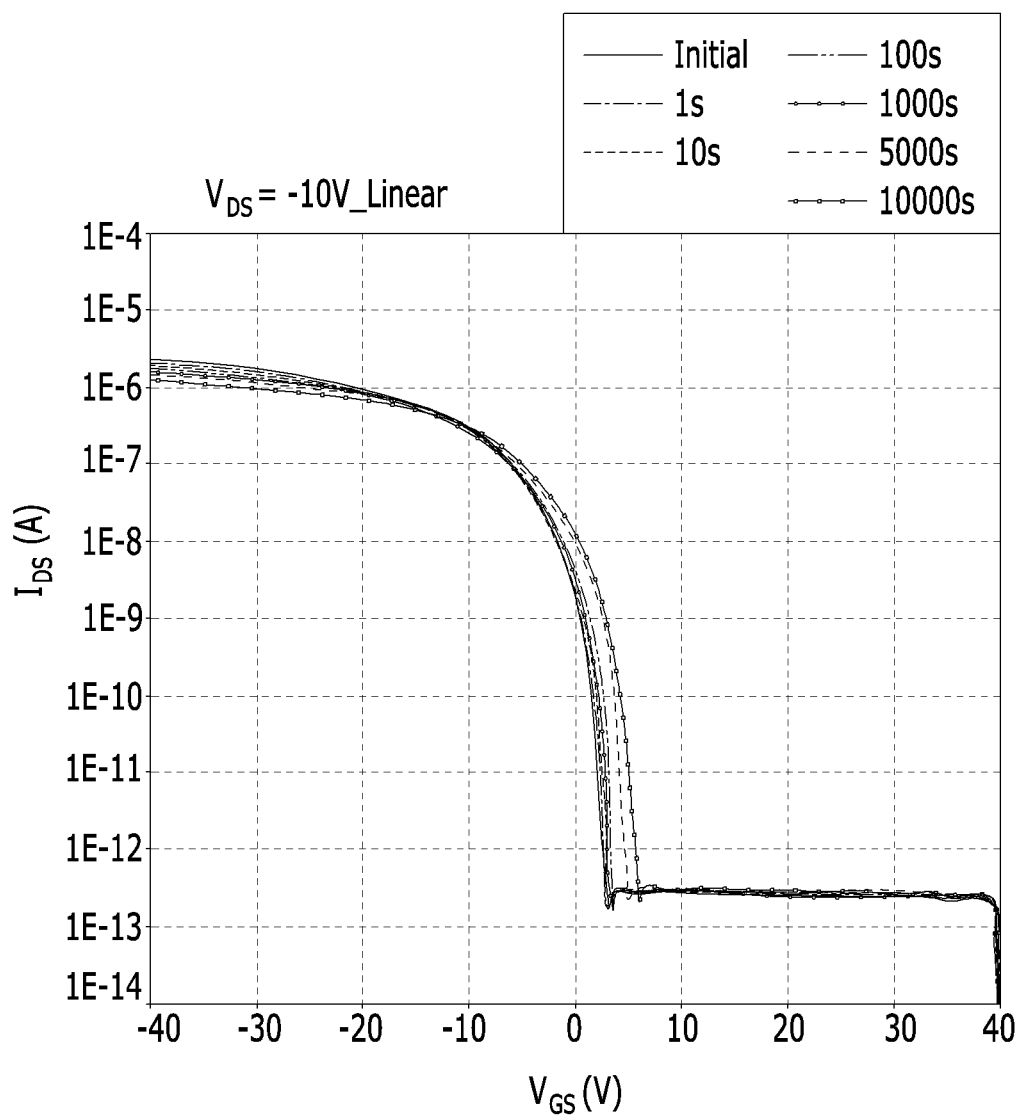
FIGS. 8 and 9 are respectively graphs showing current transfer characteristics measured in a linear region ($V_{DS}=-10V$) and a saturation region ($V_{DS}=-40V$) of the organic thin film transistor according to Example 3.
Figure 9:
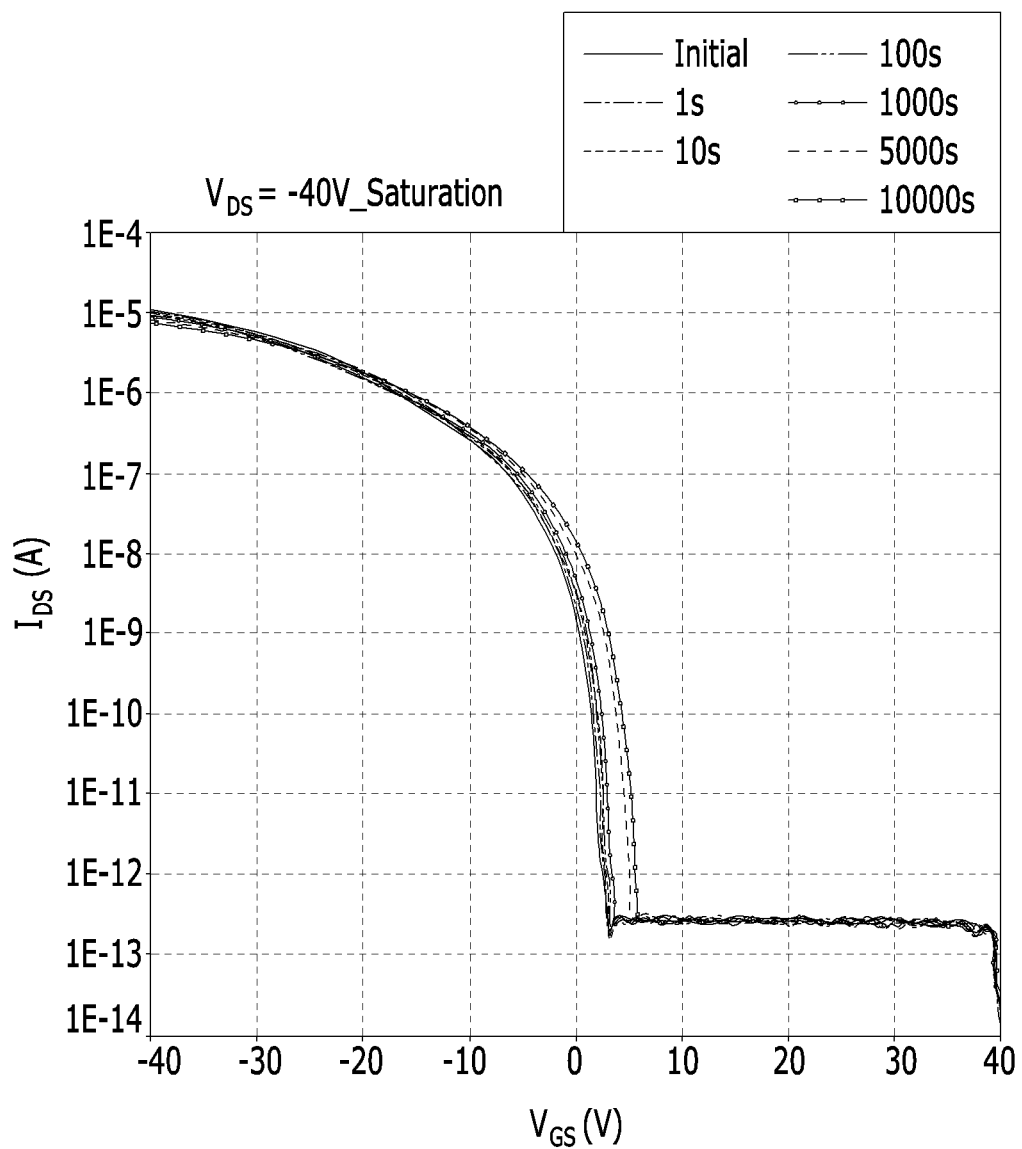
Figure 10:
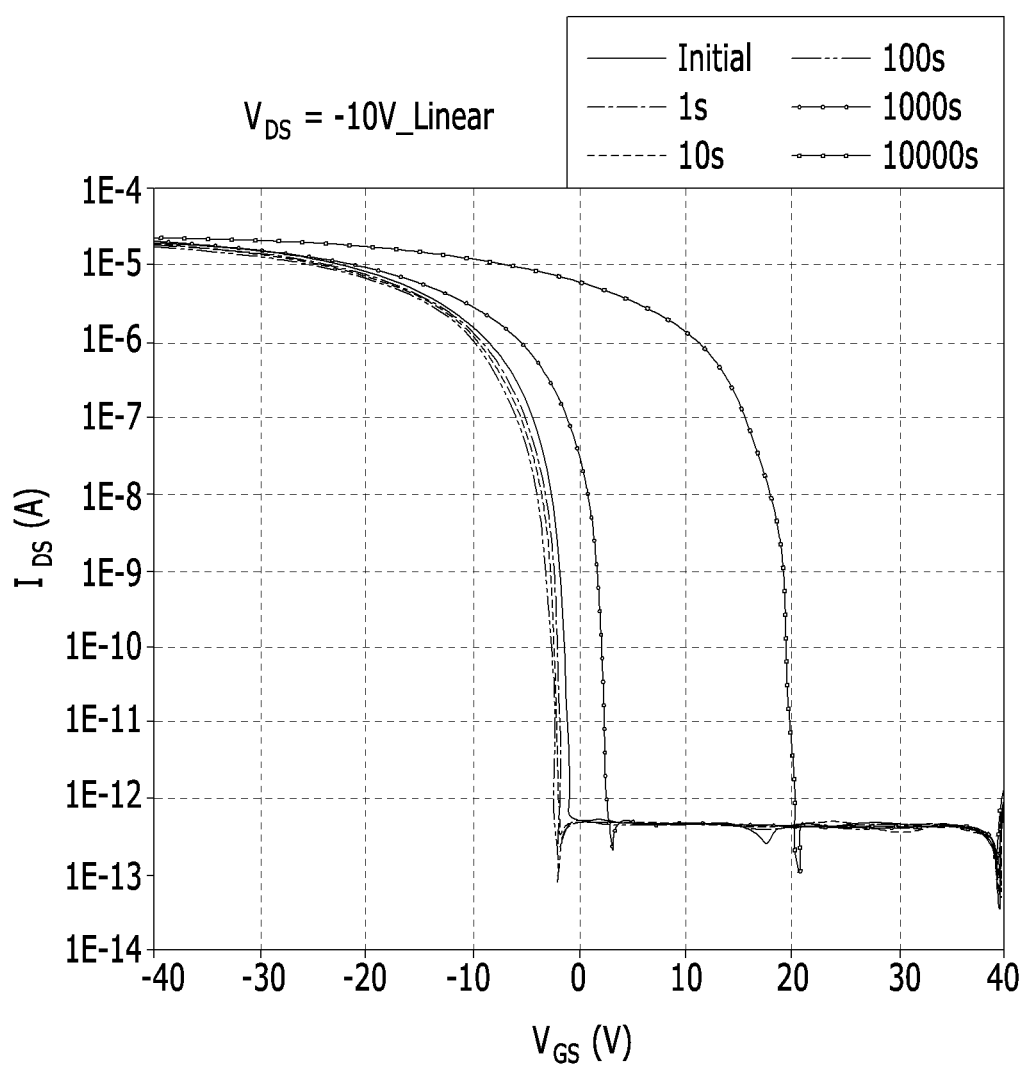
FIGS. 10 and 11 are respectively graphs showing current transfer characteristics measured in a linear region ($V_{DS}=-10V$) and a saturation region ($V_{DS}=-40V$) of the organic thin film transistor according to Comparative Example 1.
Figure 11:
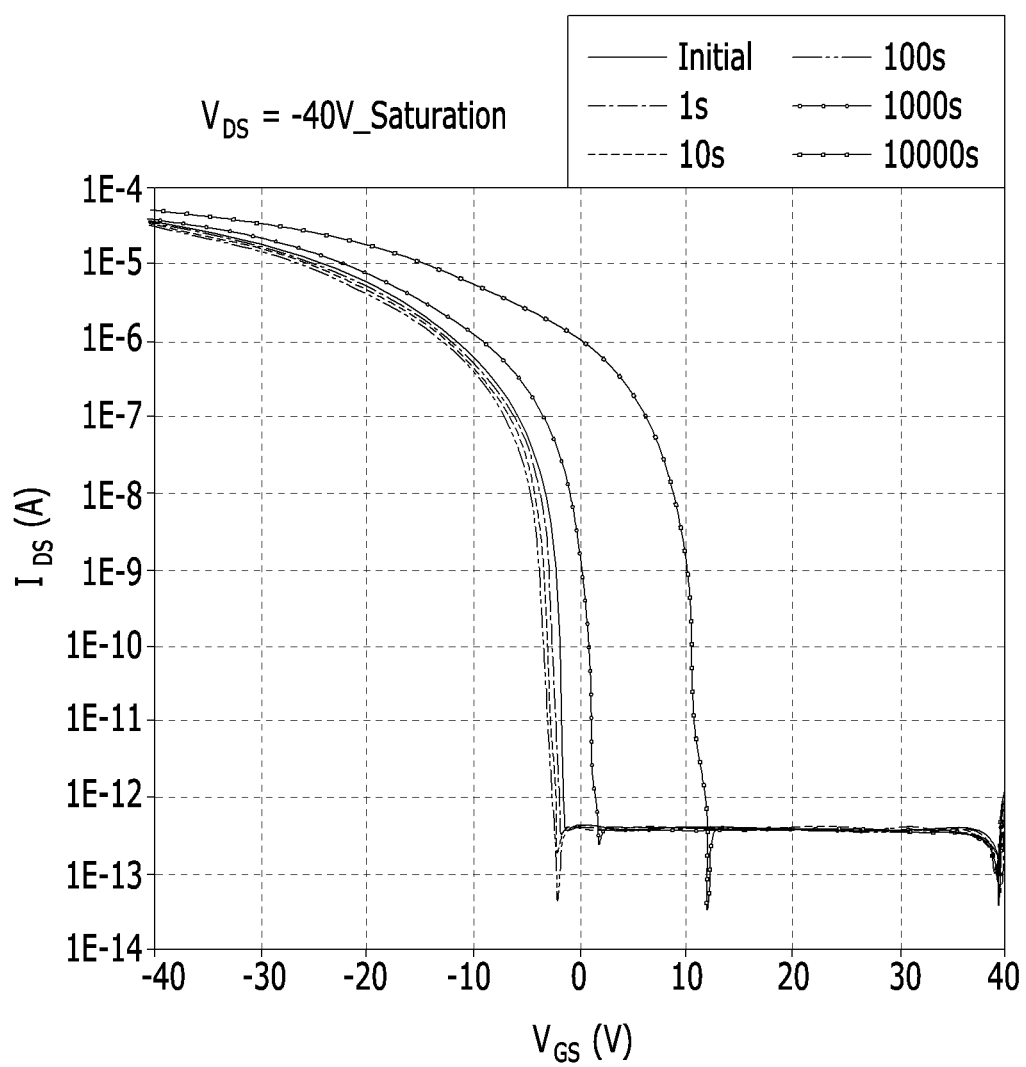
Figure 12:
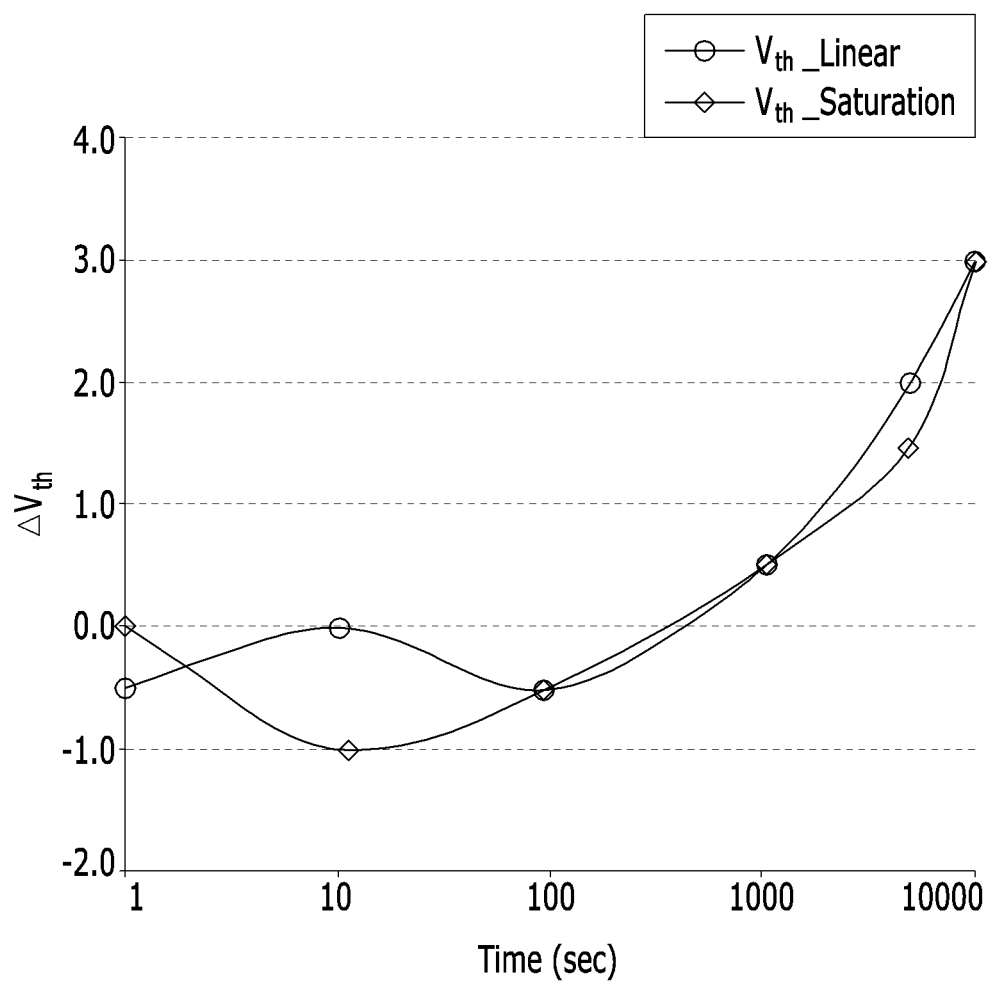
FIGS. 12 to 15 are respectively graphs showing threshold voltage change ($\Delta V_{TH}$) when the organic thin film transistors according to Examples 1 to 3 and Comparative Example 1 are driven in a linear region and a saturated region.
Figure 13:
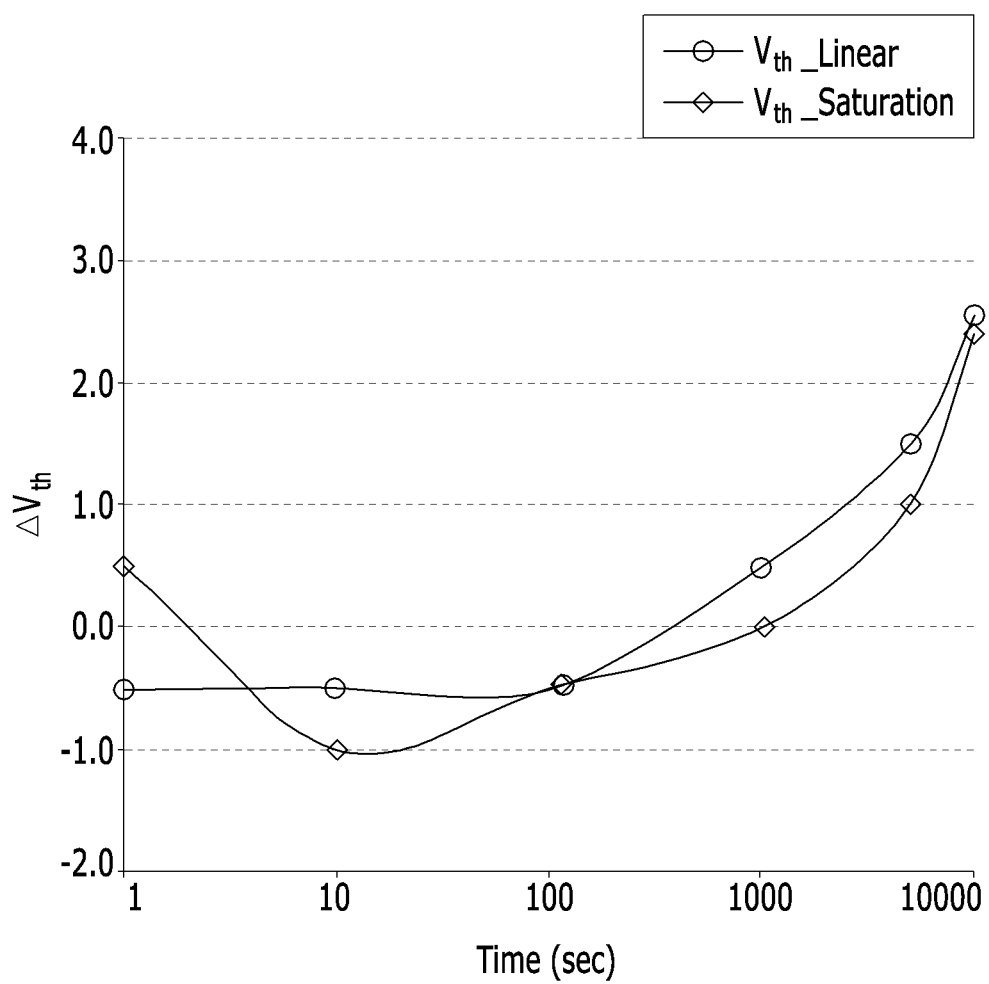
Figure 14:
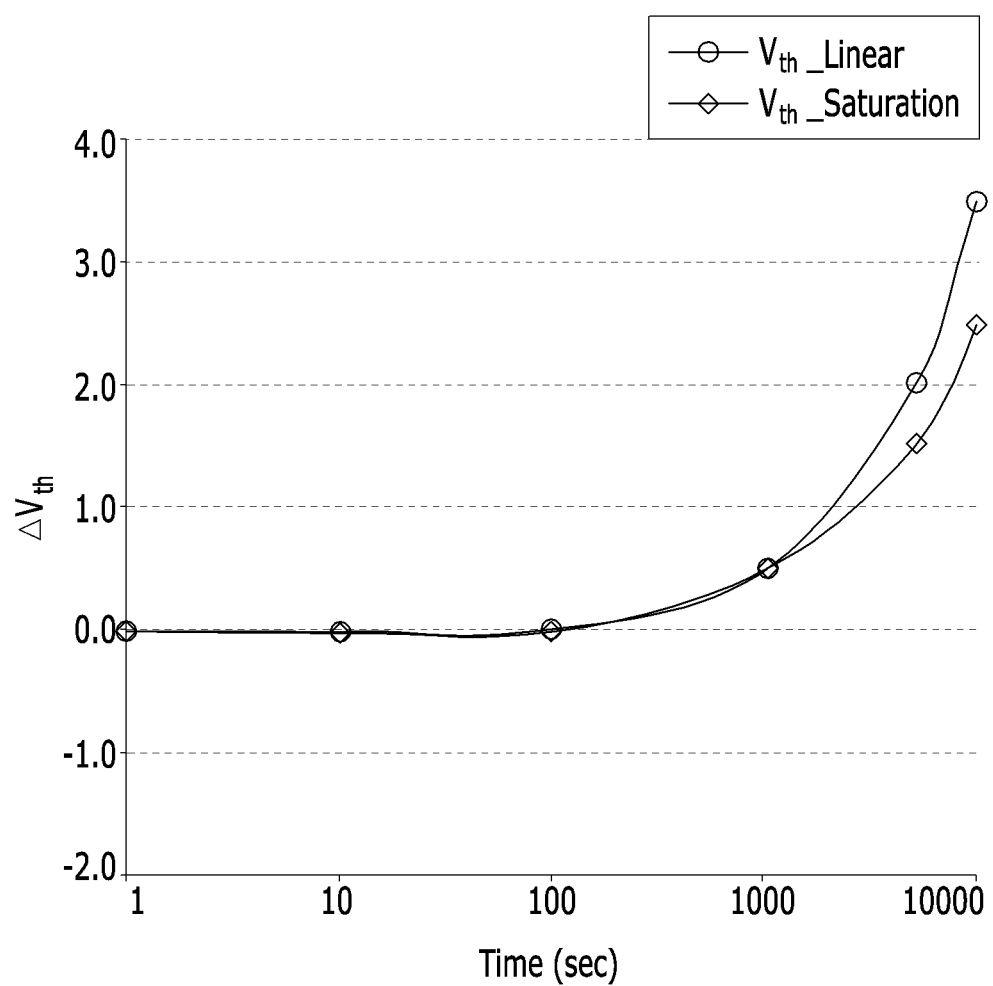
Figure 15:
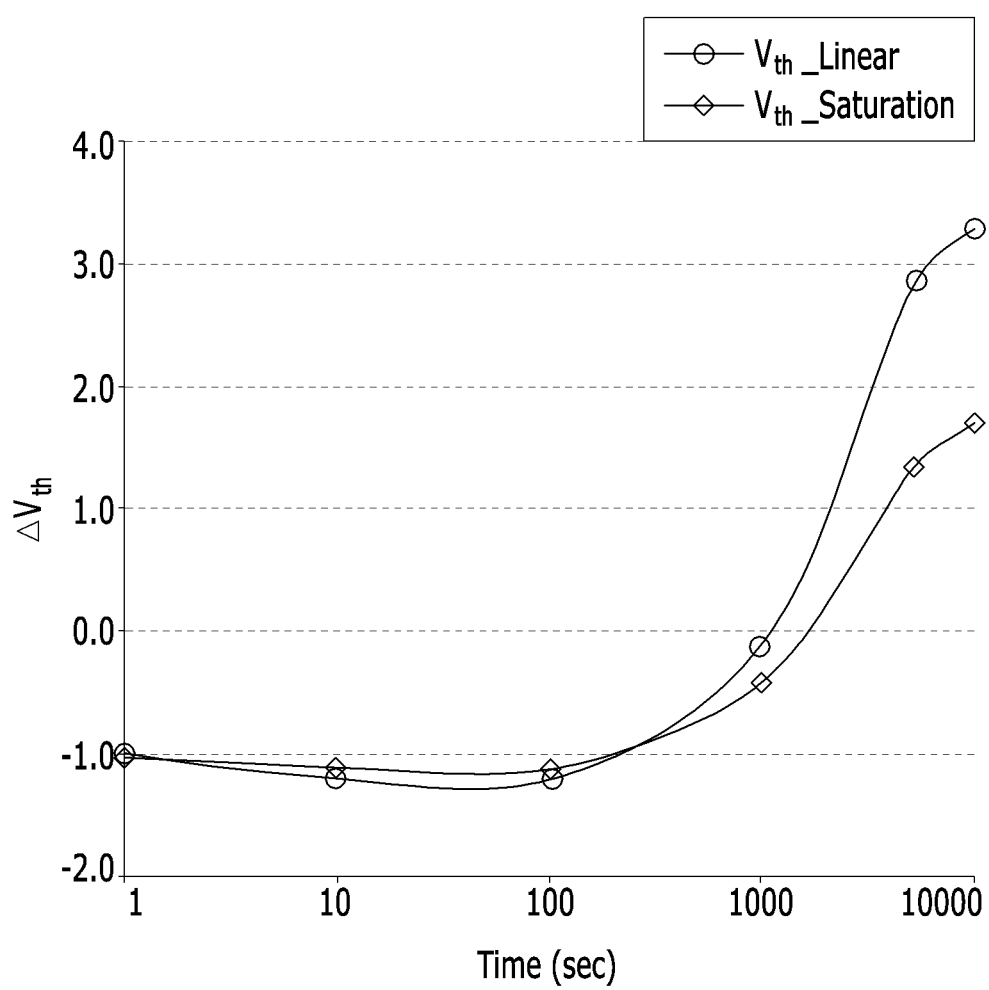

The organic thin film transistors according to Examples 1 to 3 and Comparative Example 1 are measured to determine electrical characteristics using a Semiconductor Characterization System (4200-SCS) manufactured by KEITHLEY. FIG. 4 shows the results of the organic thin film transistor according to Example 1 when being driven in a linear region ($V_{DS}$=−10V), and FIG. 5 shows the results when being driven in a saturation region ($V_{DS}$=−40V). FIG. 6 shows the results of the organic thin film transistor according to Example 2 when being driven in a linear region ($V_{DS}$=−10V), and FIG. 7 shows the results when being driven in a saturation region ($V_{DS}$=−40V). FIG. 8 shows the results of the organic thin film transistor according to Example 3 when being driven in a linear region ($V_{DS}$=−10V), and FIG. 9 shows the results when being driven in a saturation region ($V_{DS}$=−40V). FIG. 10 shows the results of the organic thin film transistor according to Comparative Example 1 when being driven in a linear region ($V_{DS}$=−10V), and FIG. 11 shows the results when being driven in a saturation region ($V_{DS}$=−40V). FIGS. 12 to 15 show the threshold voltage changes ($\Delta V_{TH}$) when the organic thin film transistors according to Examples 1 to 3 and Comparative Example 1 are driven in the linear region ($V_{DS}$=−10 V) and the saturation region ($V_{DS}$=−40V).

The results are also shown in Table 1.

TABLE 1

| Time (sec) | Threshold Voltage (V) | | | | | | | |
|---|---|---|---|---|---|---|---|---|
| | Example 1 | | Example 2 | | Example 3 | | Comparative Example 1 | |
| | Lin. | Sat. | Lin. | Sat. | Lin. | Sat. | Lin. | Sat. |
| 0 | 3.0 | 3.0 | −1.0 | −1.0 | 3.0 | 3.0 | −1.0 | −1.5 |
| 1 | 2.5 | 3.0 | −1.5 | −0.5 | 3.0 | 3.0 | −1.0 | −1.5 |
| 10 | 3.0 | 2.0 | −1.5 | −2.0 | 3.0 | 3.0 | −2.0 | −2.0 |
| 100 | 2.5 | 2.5 | −1.5 | −1.5 | 3.0 | 3.0 | −2.0 | −2.0 |
| 1,000 | 3.5 | 3.5 | −0.5 | −1.0 | 3.5 | 3.5 | 3.5 | 1.5 |
| 5,000 | 5.0 | 4.5 | 0.5 | 0.0 | 5.0 | 4.5 | 18.0 | 10.0 |
| 10,000 | 6.0 | 6.0 | 1.5 | 1.5 | 6.5 | 5.5 | 20.5 | 12.0 |
| $|\Delta V_{TH}|$ | 3.0 | 3.0 | 2.5 | 2.5 | 3.5 | 2.5 | 21.5 | 13.5 |

In the Table 1, $|\Delta V_{TH}|$ refers to a difference between $V_{TH}$ at 10,000 seconds and $V_{TH}$ at 0 second.

As shown in FIG. 12 to FIG. 15 and Table 1, when the organic thin film transistors according to Example 1 to 3 have a threshold voltage changes ($\Delta V_{TH}$) of less than or equal to 3.5V while the organic thin film transistor according to Comparative Example 1 has a higher threshold voltage ($\Delta V_{TH}$) change according to passage of time.

Figure 16:
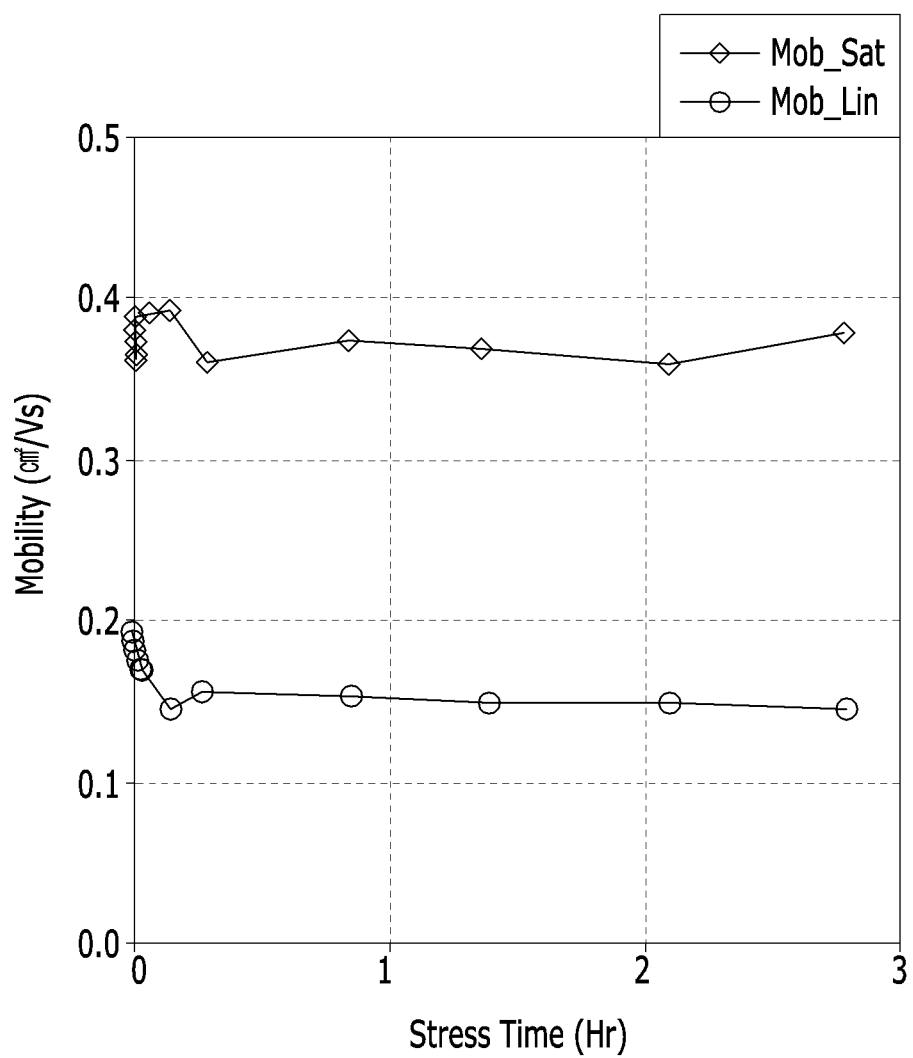
FIGS. 16 and 17 are respectively graphs showing charge mobility when the organic thin film transistors according to Example 1 and Comparative Example 1 are driven in a linear region and a saturated region.
Figure 17:
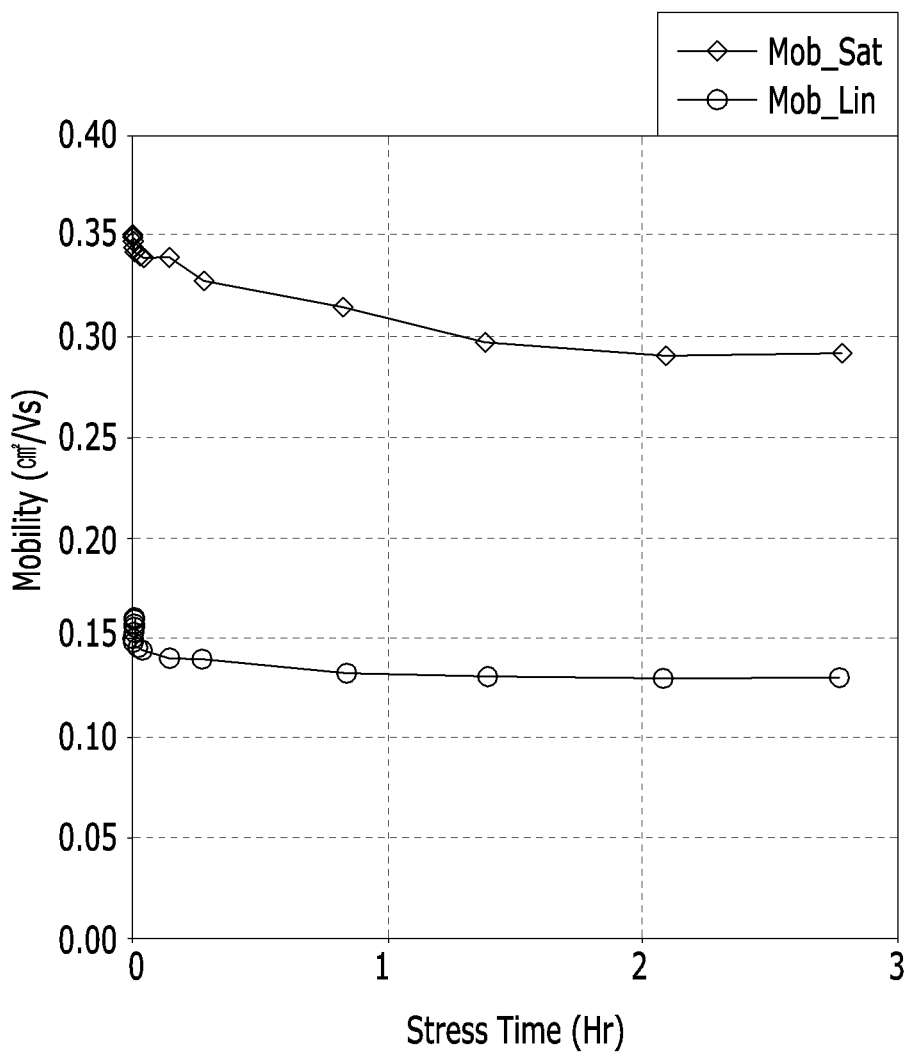

Charge mobility of the organic thin film transistors according to Example 1 and Comparative Example 1 are shown in FIGS. 16 and 17 when being driven in the linear region ($V_{DS}$=−10V) and the saturation region ($V_{DS}$=−40V). As shown in FIGS. 16 and 17, charge mobility of the organic thin film transistor according to Example 1 is similar to that of the organic thin film transistor according to Comparative Example 1, indicating that the organic passivation layer does not have an effect on charge mobility of the organic thin film transistor.

While some example embodiments have been particularly shown and described, it will be understood by one of ordinary

What is claimed is:

1. An organic passivation composition, comprising:
a cross-linking agent; and
an oligomer or a polymer including a first structural unit and a second structural unit,
the first structural unit including structural units represented by the following Chemical Formulae 1 and 2,

[Chemical Formula 1]

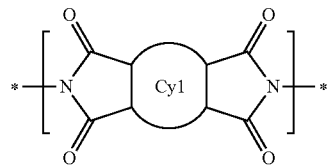

wherein, in Chemical Formula 1,
Cy1 is a functional group including one of a substituted or unsubstituted C4 to C20 carbocyclic group, a substituted or unsubstituted C6 to C20 monocyclic aromatic group, a substituted or unsubstituted C2 to C20 condensed polycyclic aromatic group, and a C2 to C20 non-condensed polycyclic aromatic group,

[Chemical Formula 2]

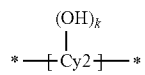

wherein, in Chemical Formula 2,
Cy2 is one of a substituted or unsubstituted C6 to C40 arylene group, a substituted or unsubstituted C3 to C40 heteroarylene group, a substituted or unsubstituted C5 to C40 cycloalkylene group, and a substituted or unsubstituted C5 to C40 heterocycloalkylene group,
k is an integer of 2 or more, and
the second structural unit includes at least one structural unit represented by the following Chemical Formula 3,

 [Chemical Formula 3]

wherein, in Chemical Formula 3,
Cy3 is one of a substituted or unsubstituted C6 to C40 arylene group, a substituted or unsubstituted C3 to C40 heteroarylene group, a substituted or unsubstituted C5 to C40 cycloalkylene group, and a substituted or unsubstituted C5 to C40 heterocycloalkylene group.

2. The organic passivation composition of claim 1, wherein the structural units represented by Chemical Formulae 2 and 3 have a mole ratio of about 50:50 to about 90:10, respectively.

3. The organic passivation composition of claim 1, wherein Cy1 of Chemical Formula 1 includes one of the following Chemical Formulae 4-1 and 4-2:

[Chemical Formula 4-1]

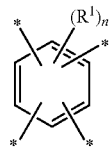

[Chemical Formula 4-2]

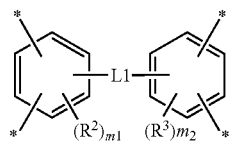

wherein, in Chemical Formulae 4-1 and 4-2,
$R^1$ to $R^3$ are each independently one of hydrogen, a hydroxy group, a halogen, a substituted or unsubstituted C1 to C15 alkyl group, a substituted or unsubstituted C1 to C15 alkoxy group, a substituted or unsubstituted C1 to C15 fluoroalkyl group, a substituted or unsubstituted C3 to C15 cycloalkyl group, a substituted or unsubstituted C3 to C15 heterocycloalkyl group, a substituted or unsubstituted C3 to C15 cycloalkyloxy group, a substituted or unsubstituted C6 to C15 aryl group, a substituted or unsubstituted C6 to C15 aryloxy group, and a substituted or unsubstituted C2 to C15 heteroaryl group,
L1 is one of a single bond, $(CR^aR^b)_p$, $(SiR^cR^d)_q$ (wherein $R^a$ to $R^d$ are each independently hydrogen, a halogen, a hydroxy group, a C1 to C10 alkyl group, a C1 to C10 fluoroalkyl group, and a C6 to C20 aryl group, and p and q are each independently integers ranging from 1 to 5), $S(=O)_2$, O, $C(=O)$, and a combination thereof, and
n, m1, and m2 are each independently an integer ranging from 0 to 2.

4. The organic passivation composition of claim 1, wherein Chemical Formula 2 includes one of the following Chemical Formulae 5-1 and 5-2:

[Chemical Formula 5-1]

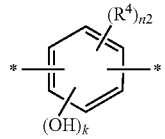

[Chemical Formula 5-2]

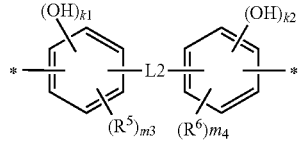

wherein, in Chemical Formulae 5-1 and 5-2,
$R^4$ to $R^6$ are each independently one of a hydrogen, a halogen, a substituted or unsubstituted C1 to C15 alkyl group, a substituted or unsubstituted C1 to C15 alkoxy group, a substituted or unsubstituted C1 to C15 fluoroalkyl group, a substituted or unsubstituted C3 to C15 cycloalkyl group, a substituted or unsubstituted C3 to C15 heterocycloalkyl group, a substituted or unsubstituted C3 to C15 cycloalkyloxy group, a substituted or unsubstituted C6 to C15 aryl group, a substituted or unsubstituted C6 to C15 aryloxy group, and a substituted or unsubstituted C2 to C15 heteroaryl group, L2 is one of a single bond, $(CR^aR^b)_p$, $(SiR^cR^d)_q$ (wherein $R^a$ to $R^d$ are each independently one of a hydrogen, a halogen, a hydroxy group, a C1 to C10 alkyl group, a C1 to C10 fluoroalkyl group, and a C6 to C20 aryl group, and p and q are each independently integers ranging from 1 to 5), $S(=O)_2$, O, $C(=O)$, and a combination thereof, n2 is an integer ranging from 0 to 2, m3 and m4 are each independently integers ranging from 0 to 4, k and k1+k2 are each independently integers of 2 or more, and k1 and k2 are integers ranging from 0 to 4.

5. The organic passivation composition of claim 1, wherein Chemical Formula 3 includes one of the following Chemical Formulae 6-1 and 6-2:

[Chemical Formula 6-1]

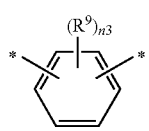

[Chemical Formula 6-2]

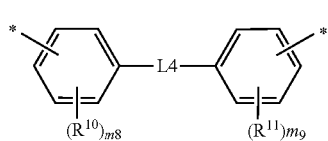

wherein, in Chemical Formulae 6-1 and 6-2, $R^9$ to $R^{11}$ are each independently one of a hydrogen, a halogen, a substituted or unsubstituted C1 to C15 alkyl group, a substituted or unsubstituted C1 to C15 alkoxy group, a substituted or unsubstituted C1 to C15 fluoroalkyl group, a substituted or unsubstituted C3 to C15 cycloalkyl group, a substituted or unsubstituted C3 to C15 heterocycloalkyl group, a substituted or unsubstituted C3 to C15 cycloalkyloxy group, a substituted or unsubstituted C6 to C15 aryl group, a substituted or unsubstituted C6 to C15 aryloxy group, and a substituted or unsubstituted C2 to C15 heteroaryl group, L4 is one of a single bond, $(CR^aR^b)_p$, $(SiR^cR^d)_q$ (wherein $R^a$ to $R^d$ are each independently one of a hydrogen, a halogen, a C1 to C10 alkyl group, a C1 to C10 fluoroalkyl group, and a C6 to C20 aryl group, and p and q are each independently integers ranging from 1 to 5), $S(=O)_2$, O, $C(=O)$, and a combination thereof, n3 is an integer ranging from 0 to 4, and m8 and m9 are each independently integers ranging from 0 to 4.

6. The organic passivation composition of claim 1, wherein Chemical Formula 2 includes one of the following Chemical Formula 7:

[Chemical Formula 7]

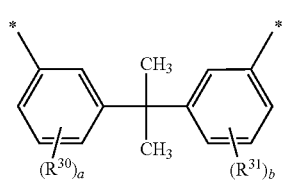

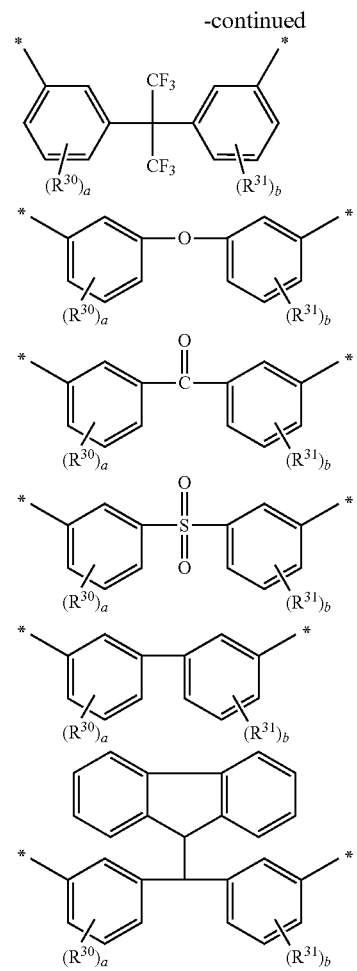

wherein, in Chemical Formula 7, $R^{30}$ and $R^{31}$ are each independently one of a hydrogen, a hydroxy group, a halogen, a substituted or unsubstituted C1 to C15 alkyl group, a substituted or unsubstituted C1 to C15 alkoxy group, a substituted or unsubstituted C1 to C15 fluoroalkyl group, a substituted or unsubstituted C3 to C15 cycloalkyl group, a substituted or unsubstituted C3 to C15 heterocycloalkyl group, a substituted or unsubstituted C3 to C15 cycloalkyloxy group, a substituted or unsubstituted C6 to C15 aryl group, a substituted or unsubstituted C6 to C15 aryloxy group, and a substituted or unsubstituted C2 to C15 heteroaryl group, provided that at least two of $R^{30}$ and $R^{31}$ are a hydroxy group, and a and b each independently range from 0 to 4, and a+b is 2 or more.

7. The organic passivation composition of claim 1, wherein Chemical Formula 3 includes one of the following Chemical Formula 8:

[Chemical Formula 8]

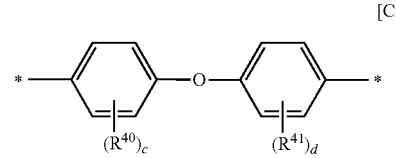

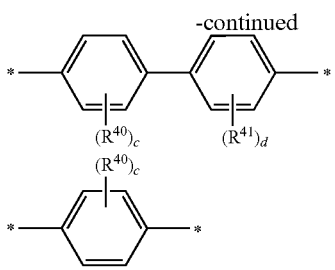

wherein, in Chemical Formula 8,
R[40] and R[41] are each independently one of a hydrogen, a halogen, a substituted or unsubstituted C1 to C15 alkyl group, a substituted or unsubstituted C1 to C15 alkoxy group, a substituted or unsubstituted C1 to C15 fluoroalkyl group, a substituted or unsubstituted C3 to C15 cycloalkyl group, a substituted or unsubstituted C3 to C15 heterocycloalkyl group, a substituted or unsubstituted C3 to C15 cycloalkyloxy group, a substituted or unsubstituted C6 to C15 aryl group, a substituted or unsubstituted C6 to C15 aryloxy group, and a substituted or unsubstituted C2 to C15 heteroaryl group,
R[40] and R[41] do not include a hydroxy group, and
c and d each independently range from 0 to 4, and c+d is 2 or more.

8. The organic passivation composition of claim 1, wherein Chemical Formula 1 comprises structural units represented by at least one of the following Chemical Formulae 9 and 10:

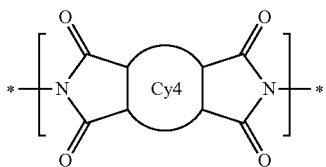

[Chemical Formula 9]

wherein, in Chemical Formula 9,
Cy4 is one of a substituted or unsubstituted C4 to C20 carbocyclic group, a substituted or unsubstituted C6 to C20 monocyclic aromatic group, a substituted or unsubstituted C2 to C20 condensed polycyclic aromatic group, and a C2 to C20 non-condensed polycyclic aromatic group, and is a cyclic group unsubstituted with at least one fluoro group or at least one C1 to C15 fluoroalkyl group,

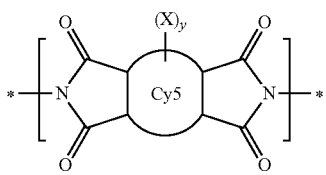

[Chemical Formula 10]

wherein, in Chemical Formula 10,
Cy5 is one of a substituted or unsubstituted C4 to C20 carbocyclic group, a substituted or unsubstituted C6 to C20 monocyclic aromatic group, a substituted or unsubstituted C2 to C20 condensed polycyclic aromatic group, and a C2 to C20 non-condensed polycyclic aromatic group, X is one of a fluoro group and a C1 to C15 fluoroalkyl group, and
y is determined by a valence of Cy5 and is an integer ranging from 1 to 4.

9. The organic passivation composition of claim 8, wherein Cy4 of Chemical Formula 9 includes one of the following Chemical Formulae 9-1 and 9-2, and Cy5 of Chemical Formula 10 includes one of the following Chemical Formulae 10-1 and 10-2:

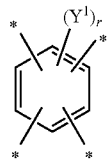

[Chemical Formula 9-1]

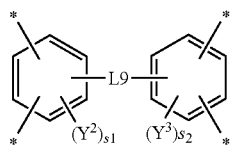

[Chemical Formula 9-2]

wherein, in Chemical Formulae 9-1 and 9-2,
$Y^1$ to $Y^3$ are each independently one of a hydrogen, a hydroxy group, a substituted or unsubstituted C1 to C15 alkyl group, a substituted or unsubstituted C1 to C15 alkoxy group, a substituted or unsubstituted C3 to C15 cycloalkyl group, a substituted or unsubstituted C3 to C15 heterocycloalkyl group, a substituted or unsubstituted C3 to C15 cycloalkyloxy group, a substituted or unsubstituted C6 to C15 aryl group, a substituted or unsubstituted C6 to C15 aryloxy group, and a substituted or unsubstituted C2 to C15 heteroaryl group,
L9 is one of a single bond, $(CR^aR^b)_p$, $(SiR^cR^d)_q$ (wherein $R^a$ to $R^d$ are each independently one of a hydrogen, a hydroxy group, a C1 to C10 alkyl group, or a C6 to C20 aryl group, and p and q are each independently integers ranging from 1 to 5), $S(=O)_2$, O, $C(=O)$, and a combination thereof, and
r, s1, and s2 are each independently integers ranging from 0 to 2,

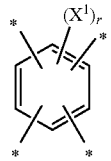

[Chemical Formula 10-1]

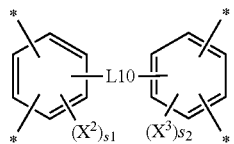

[Chemical Formula 10-2]

wherein, in Chemical Formulae 10-1 and 10-2,
$X^1$ to $X^3$ are each independently one of a fluoro group and a C1 to C15 fluoroalkyl group, L10 is one of a single bond, $(CR^aR^b)_p$, $(SiR^cR^d)_q$ (wherein $R^a$ to $R^d$ are each independently one of a hydrogen, a halogen (—F, —Cl, —Br, or —I), a hydroxy group, a C1 to C10 alkyl group, a C1 to C10 fluoroalkyl group, or a C6 to C20 aryl group, and p and q are each independently integers ranging from 1 to 5), $S(=O)_2$, O, $C(=O)$, and a combination thereof, r, s1, and s2 are each independently integers ranging from 0 to 2, and each C6 aromatic ring of the above Chemical Formulae 10-1 and 10-2 is optionally substituted with a substituent including one of a C1 to C15 alkyl group, a substituted or unsubstituted C1 to C15 alkoxy group, a substituted or unsubstituted C3 to C15 cycloalkyl group, a substituted or unsubstituted C3 to C15 heterocycloalkyl group, a substituted or unsubstituted C3 to C15 cycloalkyloxy group, a substituted or unsubstituted C6 to C15 aryl group, a substituted or unsubstituted C6 to C15 aryloxy group, and a substituted or unsubstituted C2 to C15 heteroaryl group.

10. The organic passivation composition of claim 8, wherein the structural unit of Chemical Formula 10 is included at about 50 mol % or less based on the total of 100 mol % of the structural units of Chemical Formula 9 and Chemical Formula 10.

11. The organic passivation composition of claim 1, wherein the cross-linking agent includes two or more vinyl ether groups.

12. The organic passivation composition of claim 1, wherein the cross-linking agent includes one of 2,2'-bis(4-(2-(vinyloxy)ethoxy)phenyl)propane (BPA-DEVE), (1,1,1-tris (4-2-(vinyloxy) ethoxy)phenyl) ethane, 1,3,5-tris(2-(vinyloxy)ethoxy)benzene, poly(ethylene glycol)divinyl ether, 4,4'-bis-but-3-enyloxy-biphenyl, 1,5-bis-but-3-enyloxy-naphthalene, and a mixture thereof.

13. The organic passivation composition of claim 1, further comprising:

a photoacid generator.

14. The organic passivation composition of claim 13, wherein the photoacid generator includes one of triarylsulfonium perfluoroalkyl sulfonate, triarylsulfonium triflate, diaryliodonium triflate, triarylsulfonium nonaflate, diaryliodonium nonaflate, succinimidyl triflate, 2,6-dinitrobenzyl sulfonate, and a combination thereof.

15. An organic passivation layer fabricated from the organic passivation composition according to claim 1.

16. A thin film transistor comprising a substrate;

a gate electrode on the substrate;

an organic semiconductor layer on the substrate;

a gate insulating layer between the gate electrode and the organic semiconductor layer;

source and drain electrodes connected to the organic semiconductor layer; and an organic passivation layer fabricated using the organic passivation composition according to claim 1,
the organic passivation layer covering at least the organic semiconductor layer.

17. An electronic device comprising:

a thin film transistor according to claim 16.

18. The thin film transistor according to claim 16, wherein a material of the gate insulating layer is the same as a material of the organic passivation layer.

19. The thin transistor according to claim 16, wherein the the organic passivation layer is configured to limit at least one of a threshold voltage change over time and a charge mobility change over time.

20. A solar cell comprising:

an organic photoactive layer between a pair of electrodes; and an organic passivation layer fabricated from the organic passivation composition according to claim 1,
the organic passivation layer covering the organic photoactive layer and the pair of electrodes.

21. A solar cell module comprising:

a plurality of organic photoactive layers,
each organic photoactive layer between a pair of electrodes; and an organic passivation layer fabricated from the organic passivation composition according to claim 1,
the organic passivation layer covering the plurality of organic photoactive layers between the pair of electrodes.

22. An organic passivation mixture comprising:

a glycol solvent; and the organic passivation composition of claim 1, wherein the cross-linking agent includes two or more vinyl ether groups.

23. The organic passivation layer composition of claim 1, wherein the second structural unit includes at least one of structural units represented by one of the following Chemical Formulae 13-14:

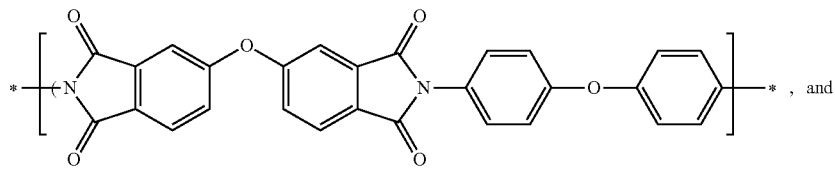

[Chemical Formula 13]

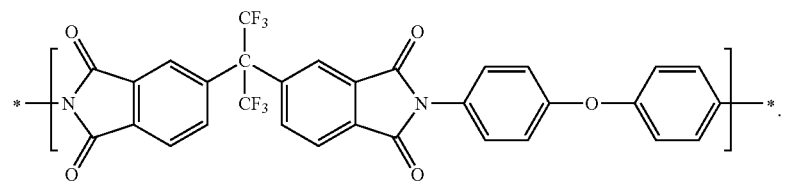

[Chemical Formula 14]

* * * * *